United States Patent [19]

Kawakami et al.

[11] Patent Number: 5,062,054
[45] Date of Patent: Oct. 29, 1991

[54] LAYOUT PATTERN GENERATION AND GEOMETRIC PROCESSING SYSTEM FOR LSI CIRCUITS

[75] Inventors: Yoshiyuki Kawakami, Miyukihigashi; Masahiro Fukui, Neyagawa; Ichiro Shigemoto, Amagasaki; Chie Iwasaki, Satanaka, all of Japan

[73] Assignee: Matsushita Electric Industrial Co., Ltd., Kadoma, Japan

[21] Appl. No.: 322,322

[22] Filed: Mar. 10, 1989

[30] Foreign Application Priority Data

Mar. 10, 1988 [JP] Japan .................................. 63-56643
Mar. 14, 1988 [JP] Japan .................................. 63-59720
May 16, 1988 [JP] Japan .................................. 63-118518

[51] Int. Cl.⁵ ........................................ G06F 15/60
[52] U.S. Cl. .................................. 364/491; 364/490; 364/489; 364/488
[58] Field of Search ................ 364/488, 489, 490, 491

[56] References Cited

U.S. PATENT DOCUMENTS

| | | | |
|---|---|---|---|
| 4,651,284 | 3/1987 | Watanabe et al. | 364/491 |
| 4,791,586 | 12/1988 | Maeda et al. | 364/491 |
| 4,829,446 | 5/1989 | Draney | 364/491 |
| 4,835,705 | 5/1989 | Fujino et al. | 364/491 |
| 4,837,447 | 6/1989 | Pierce et al. | 364/491 |
| 4,858,143 | 8/1989 | Fournier | 364/491 |

OTHER PUBLICATIONS

"A New Cad System for Automatic Logic Interconnection Verification", Miyahara et al., Musahino Electrical Communication Lab., IEEE, pp. 114–117, 1981.

Primary Examiner—Parshotam S. Lall
Assistant Examiner—V. N. Trans

[57] ABSTRACT

A printed circuit layout system using two or more of the following sub-systems: a pattern processing subsystem, a pattern design rule check subsystem, and a pattern connectivity verification characterizes any circuit pattern by a set of rectangles, each rectangle identified by a potential number and a layer, number and coordinates, and identifies terminals by potential number, layer number, and terminal names. The system eliminates the need to perform pattern OR processing and electrical connectivity search, as required by conventional schemes. The reforming and checking processes for the layout patterns are executed by a simple high speed method, making use of the features of the layout data. The system includes efficient methods for notch elimination, design rule checking, and connectivity checking.

8 Claims, 25 Drawing Sheets

LAYOUT PATTERN GENERATION AND GEOMETRIC PROCESSING SYSTEM FOR LSI CIRCUITS

BACKGROUND OF THE INVENTION

1. Field of the Invention

This invention relates to a method for automatic generation of LSI layout patterns, print substrates, and the like and more specifically concerns a method for determining the absence of errors, and implementation of changes in the layout patterns generated with reference to the design rules.

2. Description of the Prior Art

In conventional LSI patterns formed by automatic layout systems, i.e. CAD systems, it is difficult to remove the notches (depressions with widths smaller than a minimum spacing) and slits (grooves with widths smaller than a minimum spacing) formed on the patterns with the same potential. One approach is to ignore them on the assumption that they pose no hazard to the electrical performance. Another approach is to perform an OR operation on the pattern. The obtained polygonal pattern is then geometrically processed.

Ignoring the notches and slits presents problems. The notches and slits cause many pseudo-errors to be generated by the design rule check system, making detection of the intrinsic fatal errors difficult. The notches and slits may also hamper the correct formation of the patterns in the LSI fabrication process.

Using the OR operation approach also presents problems. When geometric processing is performed for a polygonal pattern, not only is processing complicated, but an OR operation of the pattern must be performed in advance.

Several studies have been reported in symposia concerning schemes for identification of the connectivity of patterns, such as N. Miyahara et al.: Proc. ISCAS Conf., pp. 114-117, 1981. However, the methods discussed, utilize the input data in polygonal form with only layer properties. The result is rather complicated processing.

OBJECTS AND SUMMARY OF THE INVENTION

An object of this invention is to provide a processing method that can be used with systems like CAD systems, to provide layout systems with an edit function, without requiring pretreatment, i.e., OR operation of the pattern, the method being effective to remove the notches and slits generated on the layout pattern or pattern contained in another pattern, providing a design rule check for the layout pattern, and a connectivity check to see if the layout pattern is connected as desired.

Another object of this invention is to provide a pattern processing system that can rapidly remove the notches and slits formed in LSI layout patterns and print substrates in a simple way.

Another object of this invention is to provide a pattern processing system that can rapidly remove the included pattern formed on LSI layout patterns and print substrates in a simple way.

Another object of this invention is to provide a design rule check system that can check, at high speed, the design rules of the LSI layout patterns and print substrates, in particular, the adjacent relationship between any two patterns and the inclusion relationship between any two patterns.

Yet another object of this invention is to provide a connectivity verification system that can verify at high speed whether the LSI layout patterns and print substrates are connected as desired.

The above-mentioned objects and general purpose of this invention is realized by expressing the LSI layout patterns or print substrates, according to sets of rectangles and sets of patterns other than rectangles. That is, wires and contacts are all expressed by rectangles. Each rectangle is identified by a potential number and a layer. Terminals are expressed by patterns other than rectangles, such as dots. Each terminal is identified by a terminal name and a layer.

This structured data is utilized in a pattern processing system that receives data for a set of rectangles identified by layer and potential number as well as the minimum spacing data defined for each layer, and then classifies the data according to layers. The system then takes out any two adjacent rectangles from the set of rectangles on each layer. These two adjacent rectangles are tested to determine whether the potential number is the same for both. The system then determines if these two adjacent rectangles are spaced closer than the minimum spacing defined for their layer. If they are spaced closer than the minimum required, the system generates a rectangle to cover the gap between the rectangles. An alternate form of this invention is to further determine whether there is overlap between the two adjacent rectangles. If it is determined that overlap exists, the two rectangles are merged and the new pattern thus formed is tested to determine if it is also a rectangle.

The system implements a design rule check. It receives a set of rectangles identified by layer and potential number as well as the minimum spacing data defined separately for each layer, followed by classification of the data according to layer. The system then takes out any two adjacent rectangles from the set of rectangles on each layer. It determines whether the two rectangles have the same potential number. For each pair, the system determines whether the rectangles are arranged with a separation larger than the minimum spacing defined for the layer containing them. The operative condition for the design rule check system is: For a set of rectangles identified by layer and potential number on two specific layers A and B, to determine whether for any rectangle on layer A, if each edge of the rectangle is expanded by a distance W in the peripheral direction, there exists a rectangle on layer B that includes the expanded rectangle. The system receives the distance W and classification of the set of rectangles on layers A and B with respect to each potential number. It takes out an arbitrary combination of layer-A rectangles and layer-B rectangle that include the rectangles from the rectangle set of each potential number. Then for each group of the rectangles taken out from layer A and layer B it determines whether the condition between layers A and B stands.

The system implemented a pattern connectivity verification. It receives the connectivity description, including the identified name (net name), given to a set of terminals that should be connected to the same potential, all the information about the set of rectangles, identified by the potential number and layer, and all the information about the set of terminals identified by the layer and terminal name. First the system finds a rectangle connected to each terminal included in the layout pattern. It then classifies the set of terminals and the set of rectangles contained in the layout pattern information by potential number. It then determines if the rectangles and terminals classified for each potential number are connected to the same potential. The system gave an identified name (net name) to each terminal, obtained from the layout information based on the connectivity description. The system determines, if the same identified name is given to all the terminals contained in a set of terminals and rectangles classified for each potential number. It then determines if any two terminals with the same identified name are included in the same set. The layout system described above can easily perform interactive manual correction of the output data.

DETAILED EXPLANATION OF THE PREFERRED EMBODIMENTS

The pattern generating and geometric processing system for LSIs of the present invention is implemented in a VAX 8650 computer. All programs are written in Fortran 77. The units described below are for the most part software subroutines used in the system.

Figure 1:
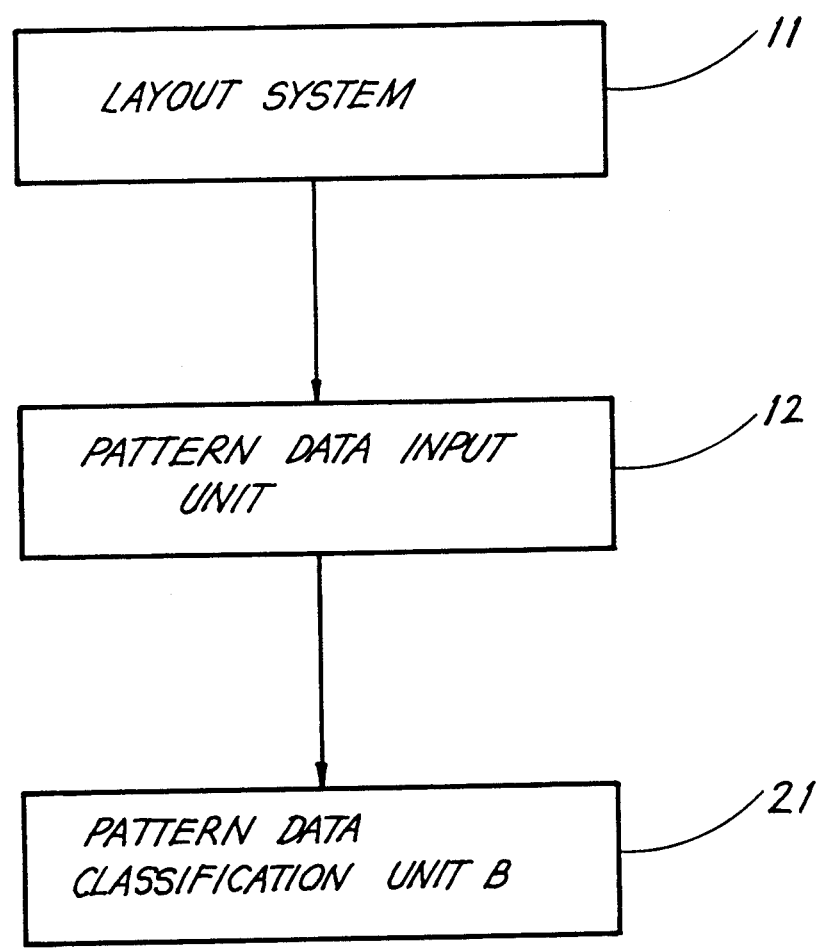
FIG. 1 is a flow diagram of a pattern treatment scheme according to the present invention.
Figure 2:
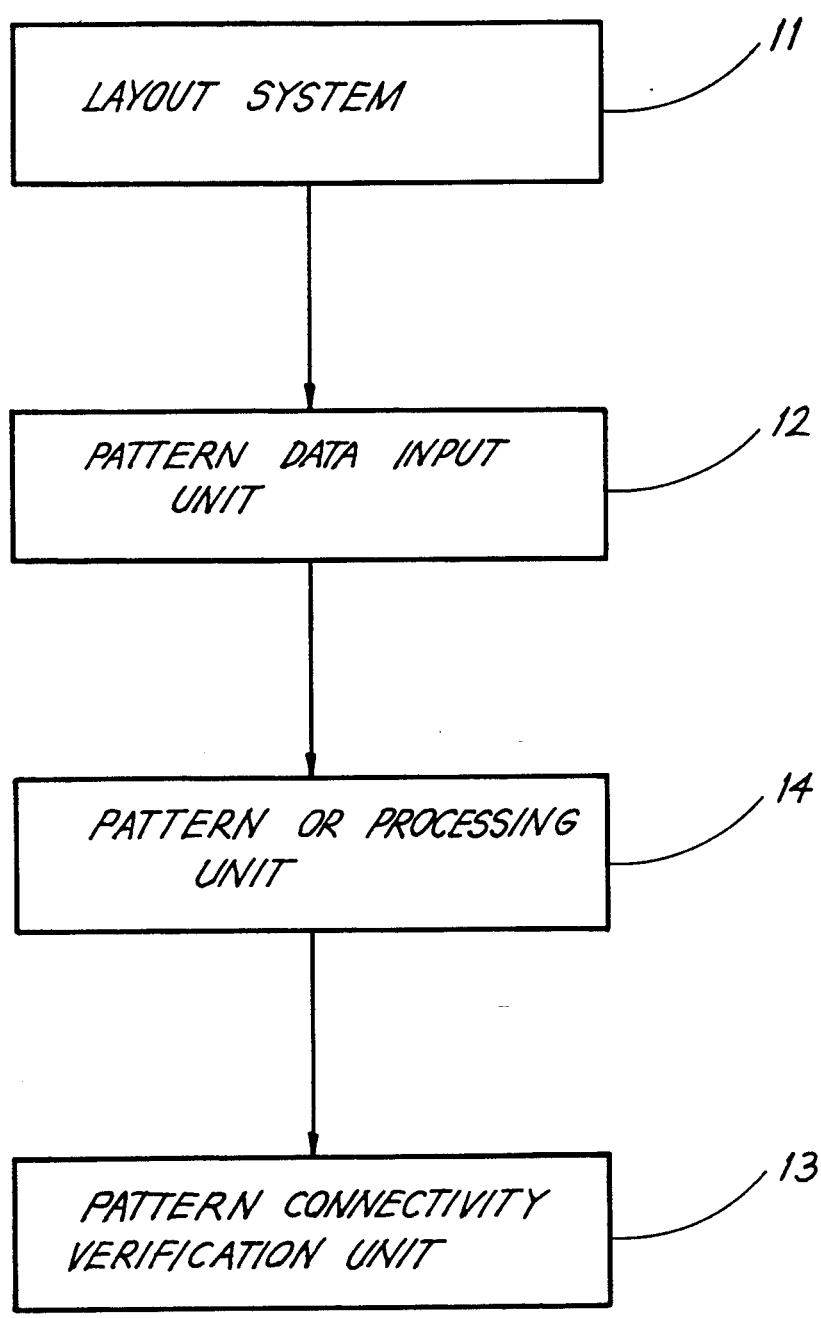
FIG. 2 is a flow diagram of a conventional pattern treatment scheme.

Let's begin by looking at the difference between the processing flow according to this invention and the conventional flow. FIG. 1 shows a flow according to this invention. FIG. 2 shows a flow according to a conventional scheme.

Figure 3:
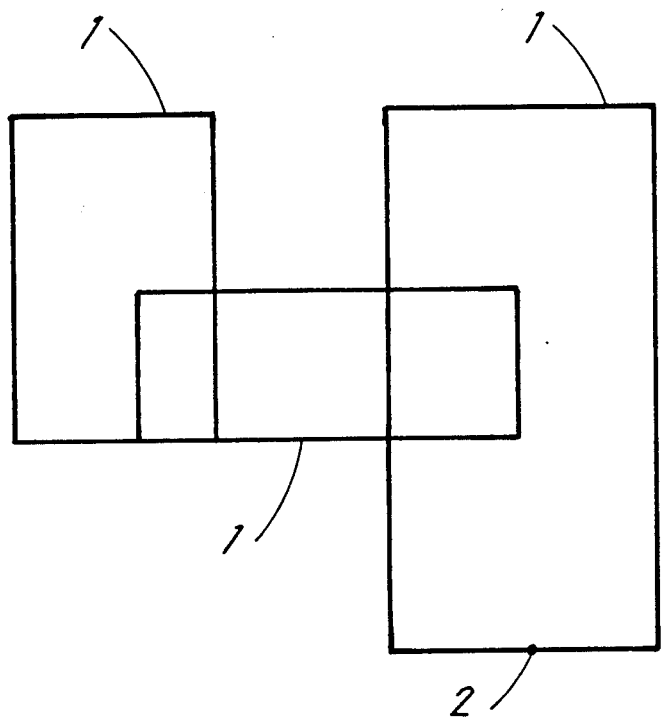
FIGS. 3 and 4 are examples of patterns formed when using a conventional processing method.
Figure 4:
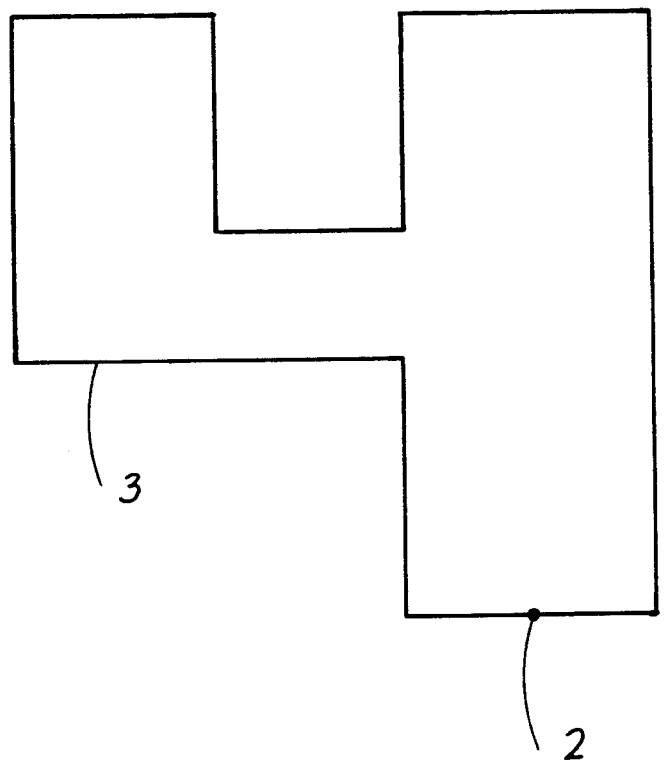

In the conventional method, usually the pattern formed by layout system 11 i.e. a CAD system is expressed by a set of rectangles 1 and dots 2 as shown in FIG. 3. The pattern is processed by an OR logic processing unit 14 and transformed into a polygonal pattern 3 as shown in FIG. 4. Afterwards, an electrical connection search is performed for the polygonal pattern by a pattern connectivity verification unit 13, or a check is performed for the spacing between the generated polygons.

On the other hand, according to this invention, a pattern is expressed by a set of rectangles identified by potential number and layer and a set of dots is identified by terminal name and layer. This coding facilitates highly efficient pattern processing system as well as a pattern design rule check system and a connectivity verification system.

By utilizing the pattern data of the present invention, efficiency of processing is increased for pattern processing, pattern design rule check, connectivity check, and all other described processes.

Pattern Processing System

Figure 5:
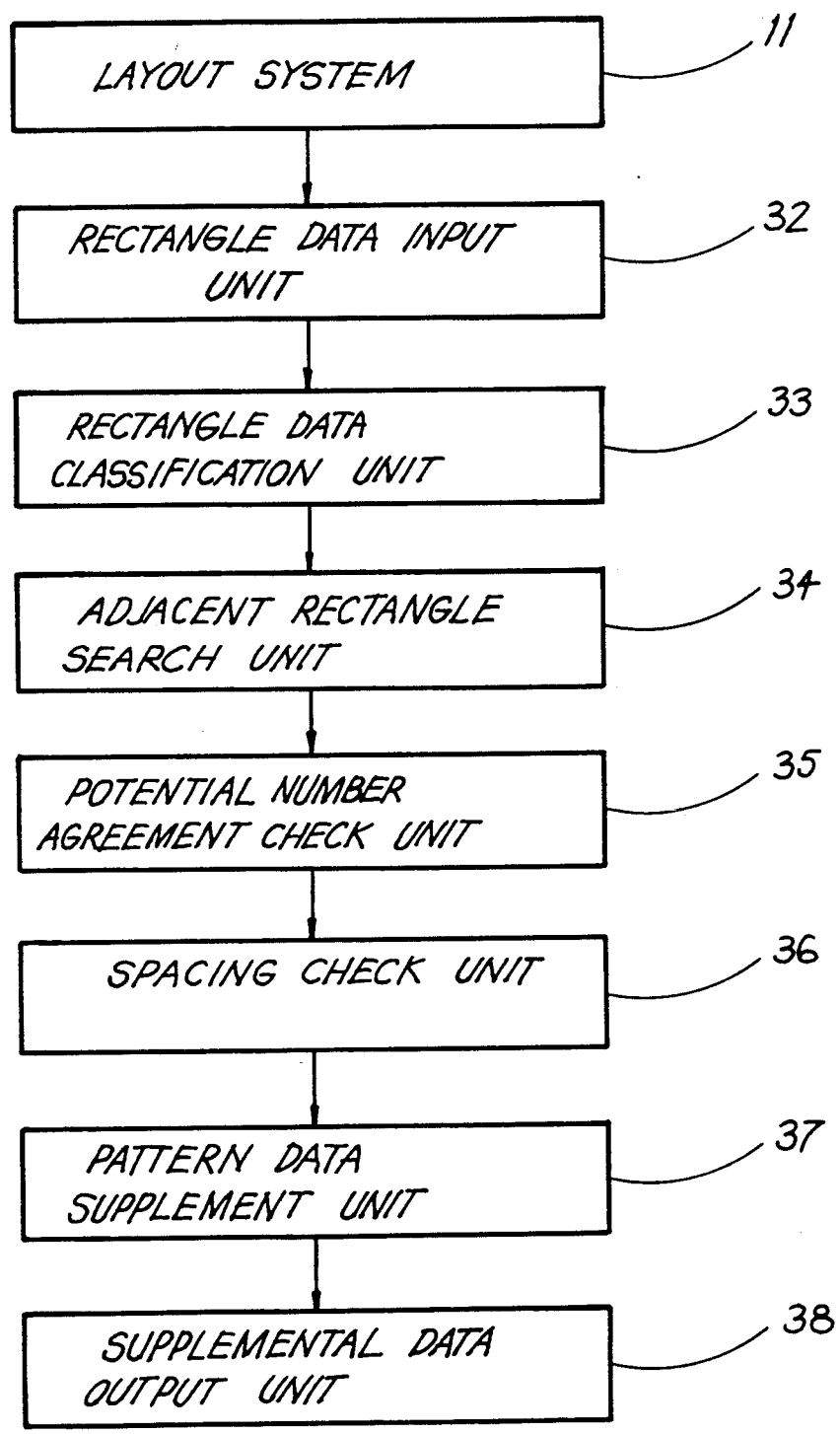
FIG. 5 is a flow diagram for a pattern processing system according to the present invention.
Figure 6:
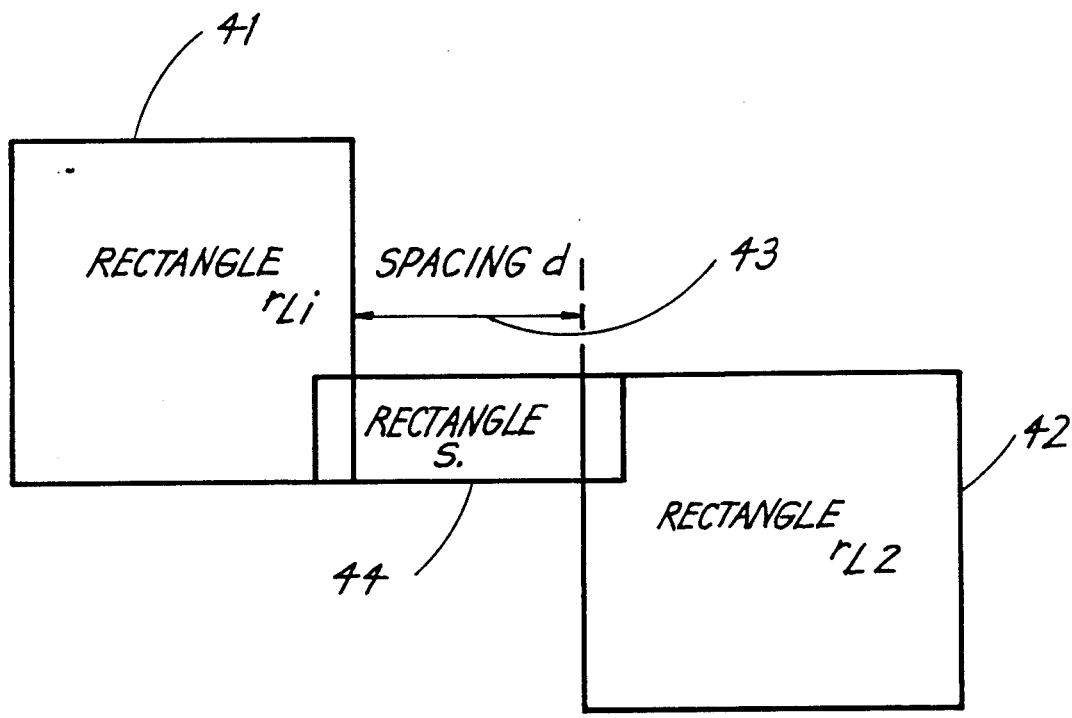
FIG. 6 is an abstracted illustration of an operation according to the present invention.

An example of the pattern processing system of this invention is illustrated in FIGS. 5 and 6. FIG. 5 shows the functional flow of this example.

All the patterns formed by the layout system 11, which may be a CAD system, are rectangles. Each of the rectangles is identified by the layer that contains it and its potential number. This identifying data is transferred to a pattern processing system by a rectangle data input unit 32. The rectangle data input unit 32 receives the rectangle data that expresses the wiring pattern being formed. Each rectangle is characterized according to its potential number, layer number and coordinates.

All the rectangles of a pattern, as identified by layer and potential number, are classified into their respective layer by a rectangle data classification unit 33. The output of unit 33 is sets of rectangles according to layer. For each layer, all the groups of adjacent rectangles are identified using an adjacent rectangle search unit 34. Adjacent rectangle search unit 34 determines that two rectangles are adjacent by the following routine.

The unit takes a first rectangle $R_A$ and expands its boundary in all directions by a spacing D, the design rule minimum distance between rectangles on this layer. The expanded rectangle $R_A'$ is tested for an other rectangle $R_B$ overlapping its boundaries. If an overlapping rectangle $R_B$ is found, an adjacent pair of rectangles $R_A$, $R_B$ is identified.

For each adjacent rectangle group $R_A$, $R_B$ identified by adjacent rectangle search unit 34, a potential number agreement check unit 35 and a spacing check unit 36 are used to determine if $R_A$ and $R_B$ have the same potential number and whether their spacing is smaller than the minimum spacing defined.

Potential number agreement check unit 35 simply compares the potential of one rectangle with the potential of the other rectangle in the pair. If the two potentials are the same the pair is identified as having the same potential.

Spacing check unit 36 determines whether the rectangle pair $R_A$, $R_B$ is spaced closer than the minimum spacing D by the following routines. The boundaries of rectangle $R_A$ are expanded in all directions by spacing D. Then the unit checks to see if rectangle $R_B$ overlaps the boundaries of the expanded rectangle $R_A'$. If it does, $R_B$ is closer to $R_A$ than the minimum spacing.

If it is determined that $R_A$ and $R_B$ have the same potential number and their spacing is smaller than the minimum spacing D, pattern data for a rectangle $R_C$ is formed between $R_A$ and $R_B$ by a pattern data supplementing unit 37. The pattern data of rectangle $R_C$ is supplied to a supplemental rectangle file (not shown) by a supplemental data output unit 38. Flow charts 16 and 17 illustrate the routine that accomplishes this process.

FIG. 6 illustrates the procedure of data supplementing unit 37 for removing a slit when two adjacent rectangles $r_{Li}$ 41 and $r_{Lj}$ 42 with the same potential number and minimum spacing (D) are given. After the spacing between rectangles $r_{Li}$ 41 and $r_{Lj}$ 42 is derived, if it is found that the two rectangles 41, 42 are not overlapped and their spacing (d) 43 is smaller than the given minimum spacing D, a rectangle S 44 is formed to cover the spacing (d) 43.

By formation of a supplemental rectangle in the notch or slit, the notch or slit is removed. The pseudo-errors that would form during the design rule check because of the notches or slits are prevented beforehand. The practical application is thus significant.

Figure 7:
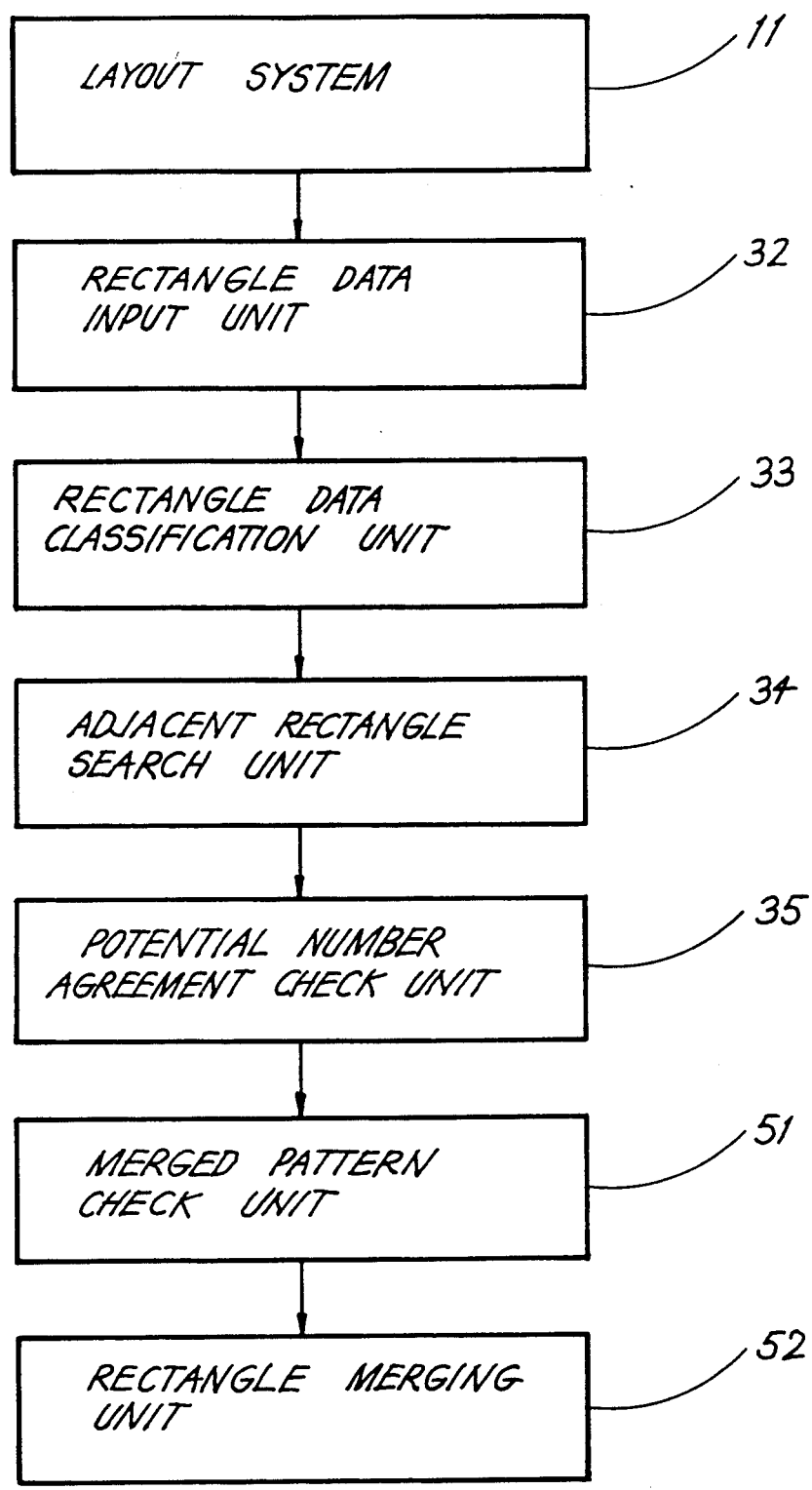
FIG. 7 is a flow diagram for a pattern processing system according to the present invention.

A second example of the pattern processing system of this invention will now be explained with reference to FIGS. 7 and 8.

The pattern formed by the layout system 11 is sent to the pattern processing system by rectangle data input unit 32. The input set of rectangles are classified by rectangle data classification unit 33 into different layers. For each layer, the groups of adjacent rectangles $R_A$ and $R_B$ are identified using adjacent rectangle search unit 34. Potential number agreement check unit 35 identifies those pairs of rectangles $R_A$ and $R_B$ that have the same potential, and a merged rectangle check unit 51 is used to determine whether they have overlapping portions, and whether the merged pattern is a rectangle.

Merged pattern check unit 51 determines if the positional relationship between two rectangles $R_A$, $R_B$ of an identified pair either overlap or touch by determining if the y(x) coordinates of the upper and lower edges of one rectangle $R_A$ match that of the other rectangle $R_B$. If they do, they either overlap or touch and the merged pattern is also a rectangle. If it is determined that $R_A$ and $R_B$ have the same potential, have overlapped portions, and that the merged pattern is a rectangular, a pattern merging unit 52 is used to form a rectangle C by merging the two rectangles $R_A$ and $R_B$. Pattern merging unit 52 simply deletes the two rectangles $R_A$ and $R_B$ and replaces them with a new rectangle $R_C$ that encloses $R_A$ and $R_B$. Flow charts 20 and 21 illustrate the routine that accomplishes this process.

Figure 8:
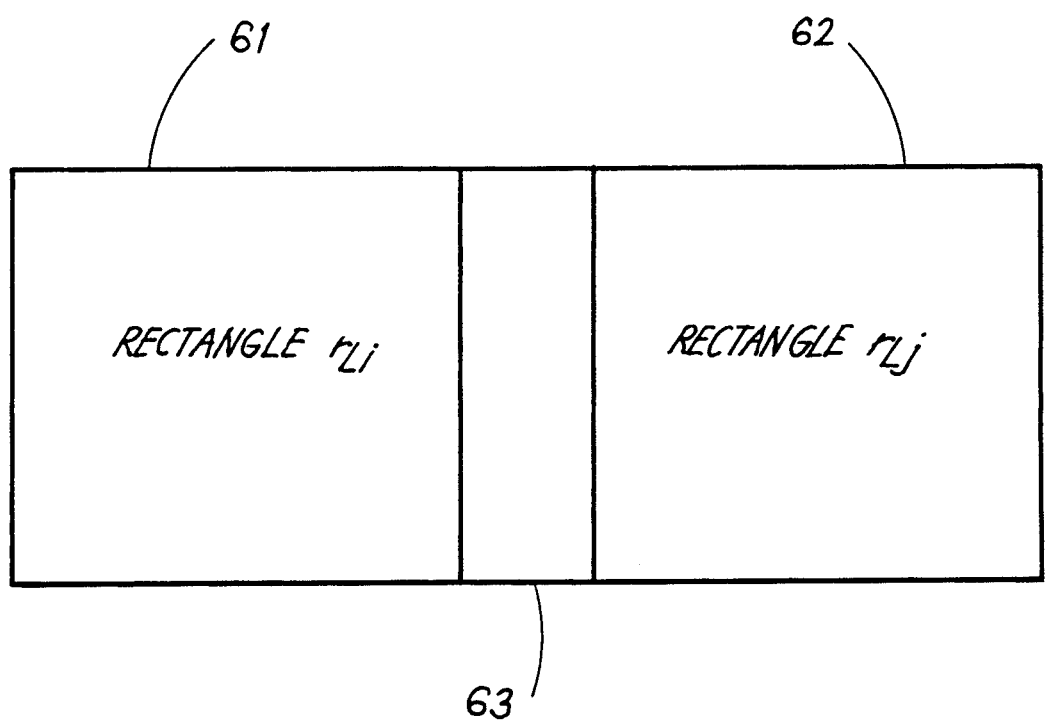
FIG. 8 is an abstracted illustration of an operation according to the present invention.

FIG. 8 shows an example of pattern merging. Rectangles $r_{Li}$ 61 and $r_{Lj}$ 62 have the same potential number identity and an overlapped portion 63. In this example, the y coordinates of the upper and lower edges of rectangles $r_{Li}$ 61 and $r_{Lj}$ 62 are derived. If the y coordinates of the upper edges and those of the lower edges are equal, respectively, the pattern data of the two rectangles are deleted, and a merged pattern for these two rectangles is formed. The same processing is performed also for two rectangles arranged in the vertical direction. In addition, if one rectangle is found fully included within another rectangle, the included rectangle will be deleted.

As shown by this example, in a case where certain patterns generated by the layout system define rectangles with potential number and layer identity, the rendering of such rectangles can be reduced.

Pattern Design Rule Check System

Figure 9:
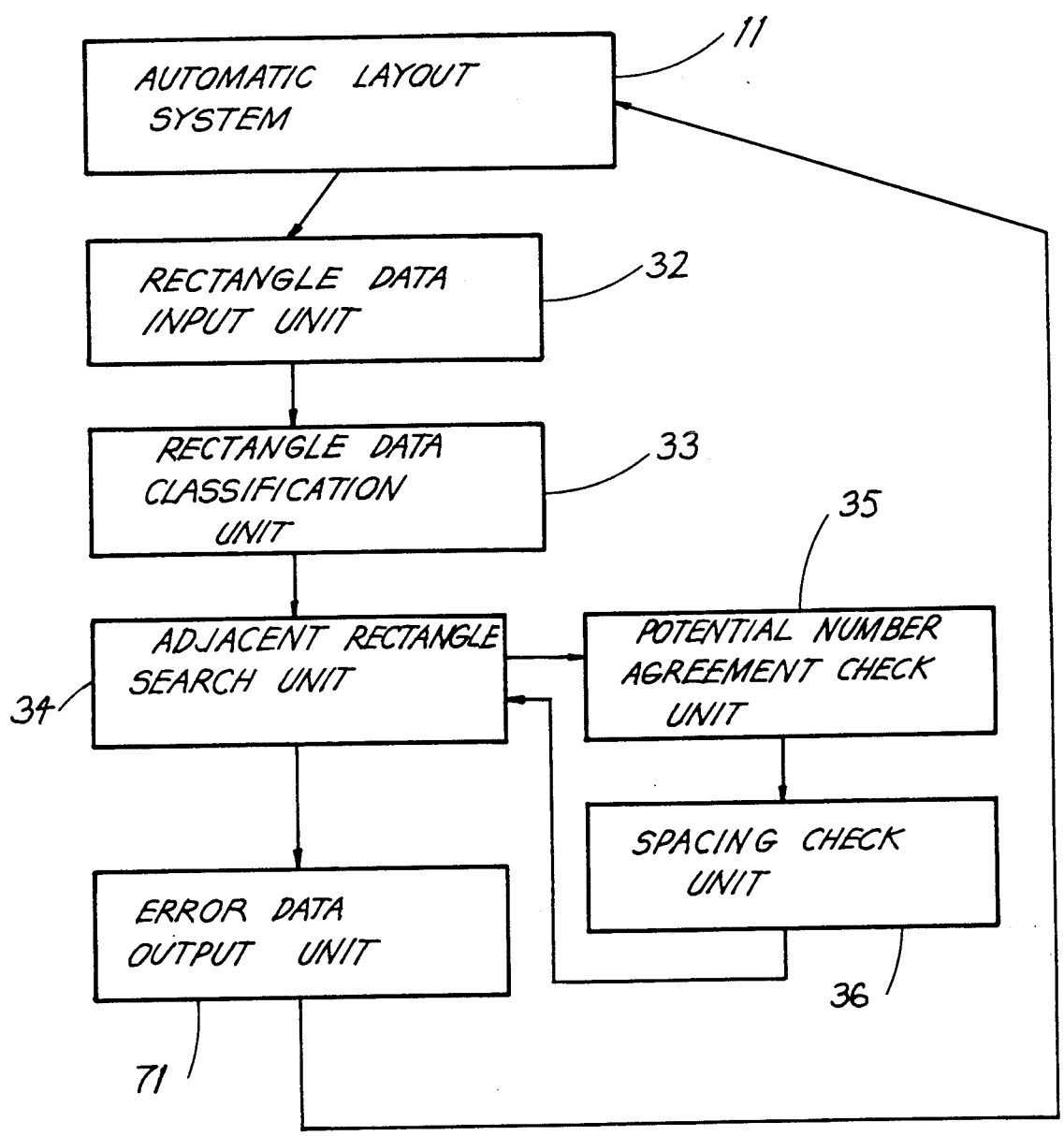
FIG. 9 is a flow diagram for a pattern processing system according to the present invention.

FIG. 9 shows an example of the pattern design rule check system of this invention. Remember that all the patterns generated by layout system 11 are rectangles, with each rectangle identified by the layer containing it and its potential number. These data are sent to the pattern design rule check system by rectangle data input unit 32.

The patterns are classified by rectangle data classification unit 33 as to their different layers. Then, for the rectangles of each layer, all the pairs of adjacent rectangles are identified by adjacent rectangle search unit 34. For each pair of adjacent rectangles $R_A$ and $R_B$ identified by adjacent rectangle search unit 34, potential number agreement check unit 35 and spacing check unit 36 are used to determine whether $R_A$ and $R_B$ meet the condition "Free".

Condition "Free" is defined as $R_A$ and $R_B$ do not have the same potential number and do not belong to the same layer L, or these two rectangles are located on layer L with a spacing larger than the design minimum spacing D.

All pairs of rectangles that fail to meet the condition "Free", are sent to the error file by error data output unit 71. The data in this file are sent back to layout system 11. Error data output unit 71 generates the coordinate data for two rectangles that violated the above stated design rules. The error data supplied are the opposite two corner coordinates of each rectangle along with its layer number and net number.

Figure 10:
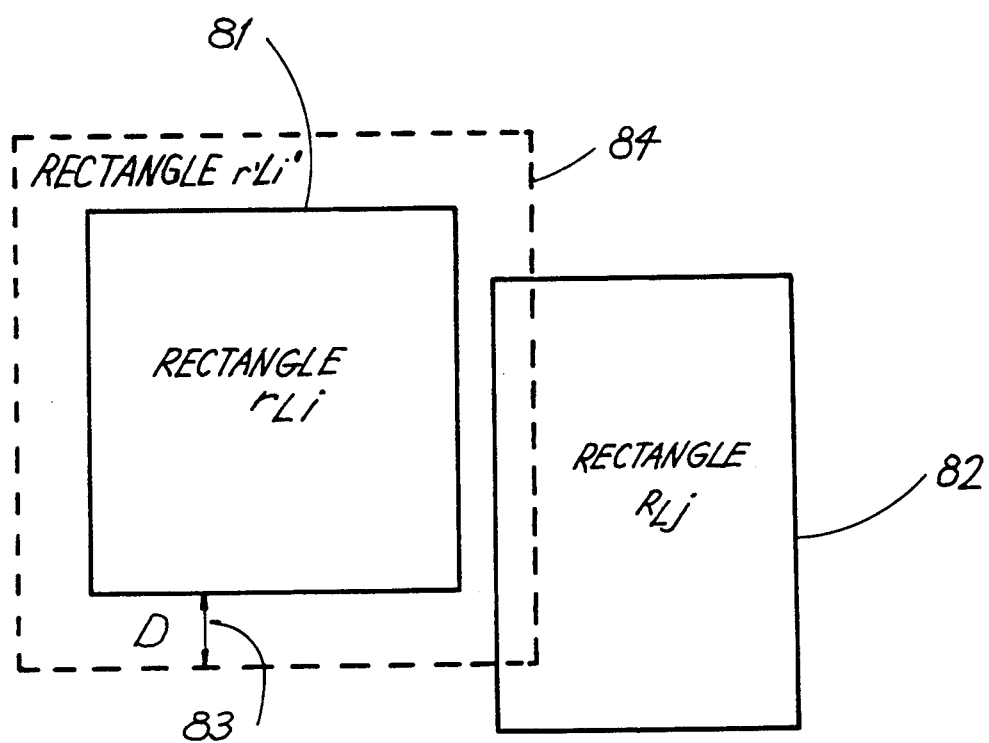
FIG. 10 is an abstracted illustration of an operation according to the present invention.

FIG. 10 illustrates the design rule check procedure in the case when two rectangles $r_{Li}$ 81 and $r_{Lj}$ 82, are checked to determine if design minimum spacing D 83 exists between them. All the edges of one rectangle $r_{Li}$ 81 are expanded by a distance D towards the periphery. An expanded rectangle $r_{Li'}$ 84 is formed. Then, an investigation is carried out to determine whether $r_{Lj}$ 82 and $r_{Li'}$ 84 overlap.

We will now discuss the processing flow of this design rule check method. The overlap check process shown in FIG. 10 is implemented by spacing check unit 36 of FIG. 9.

Overlap—Check Procedure

Figure 22:
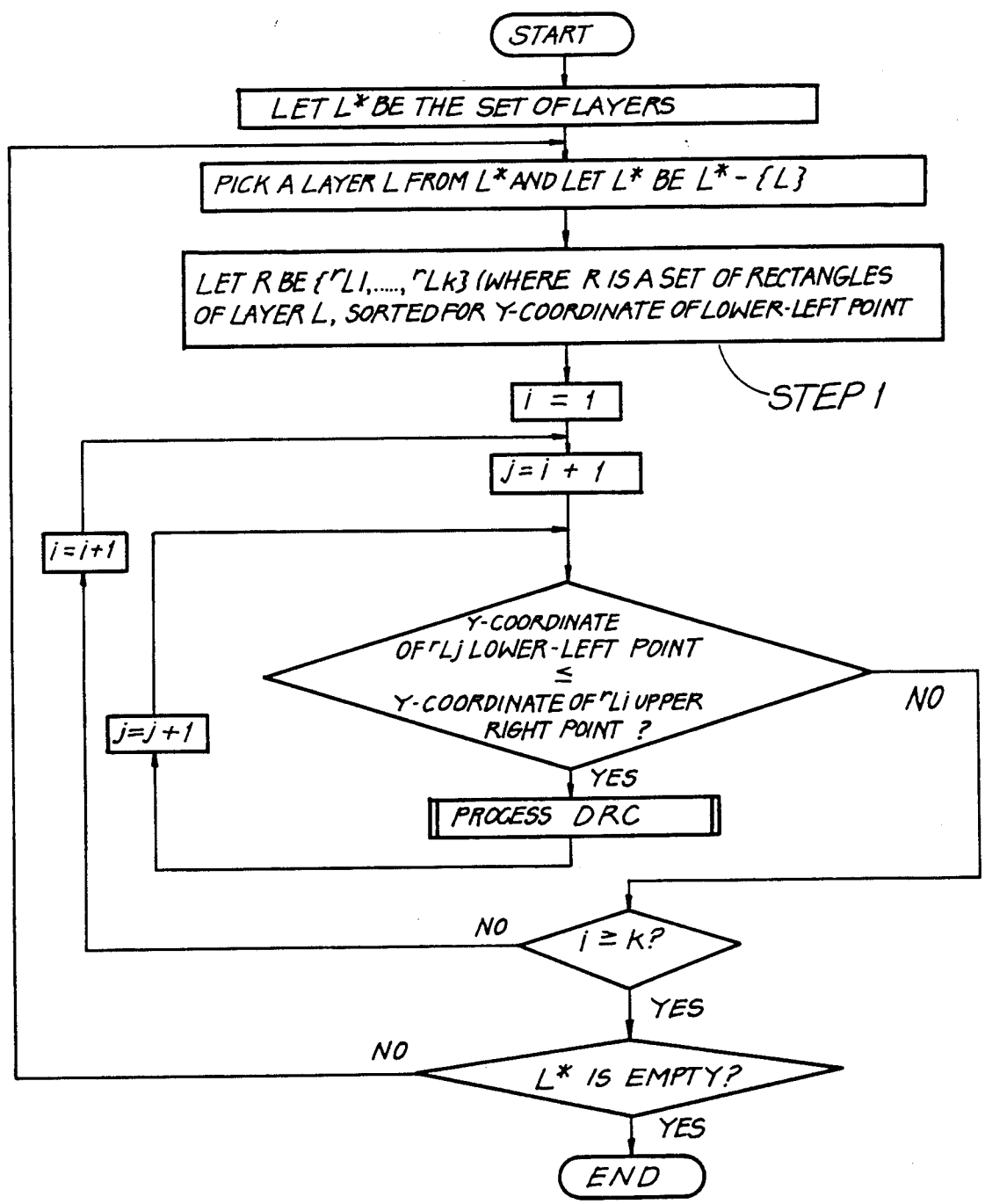
FIG. 22 is a circuit flow chart for an example of a pattern design rule check system.
Figure 23:
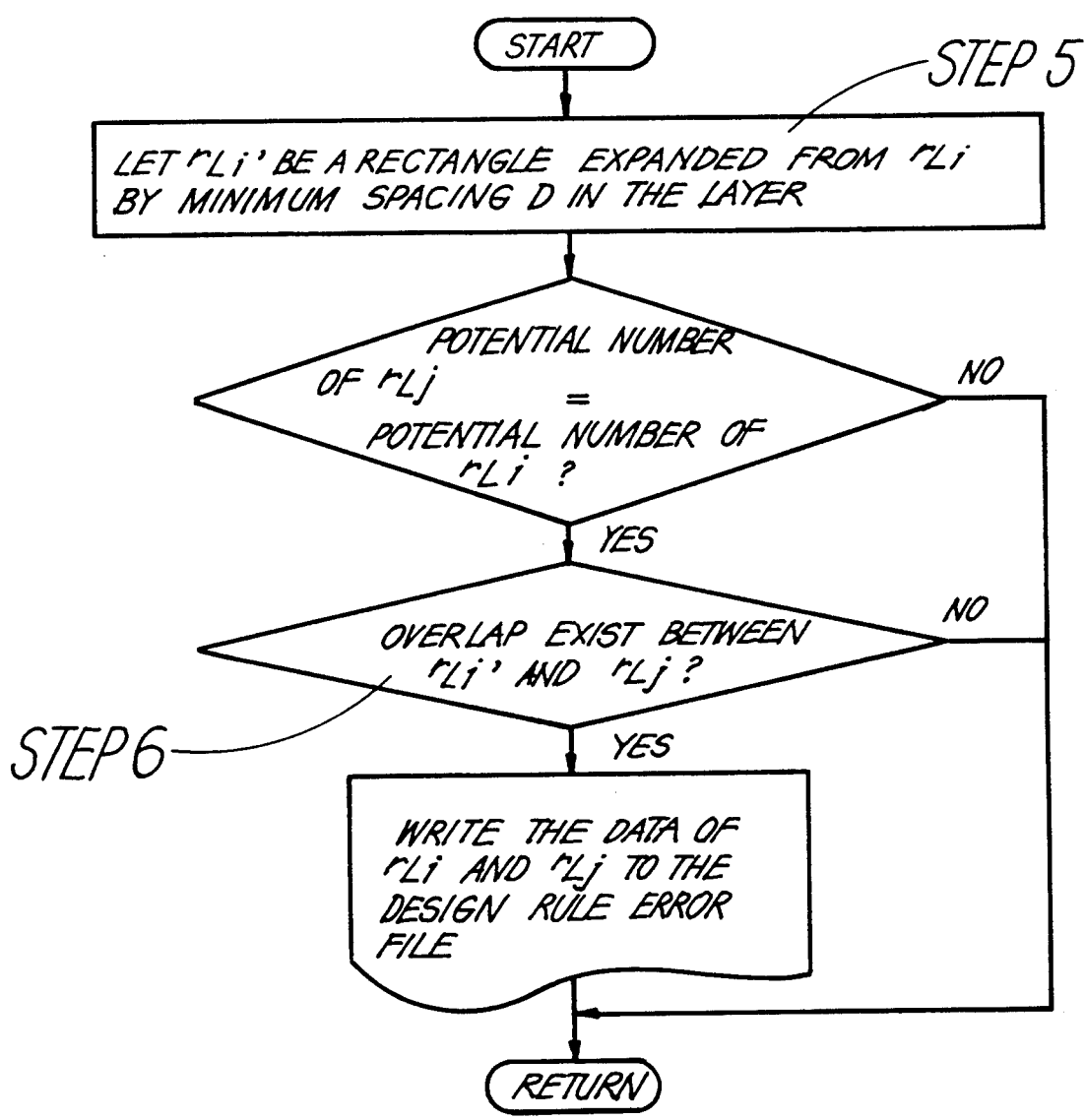
FIG. 23 is a flow chart explanation of process DRC in FIG. 22.
Figure 24:
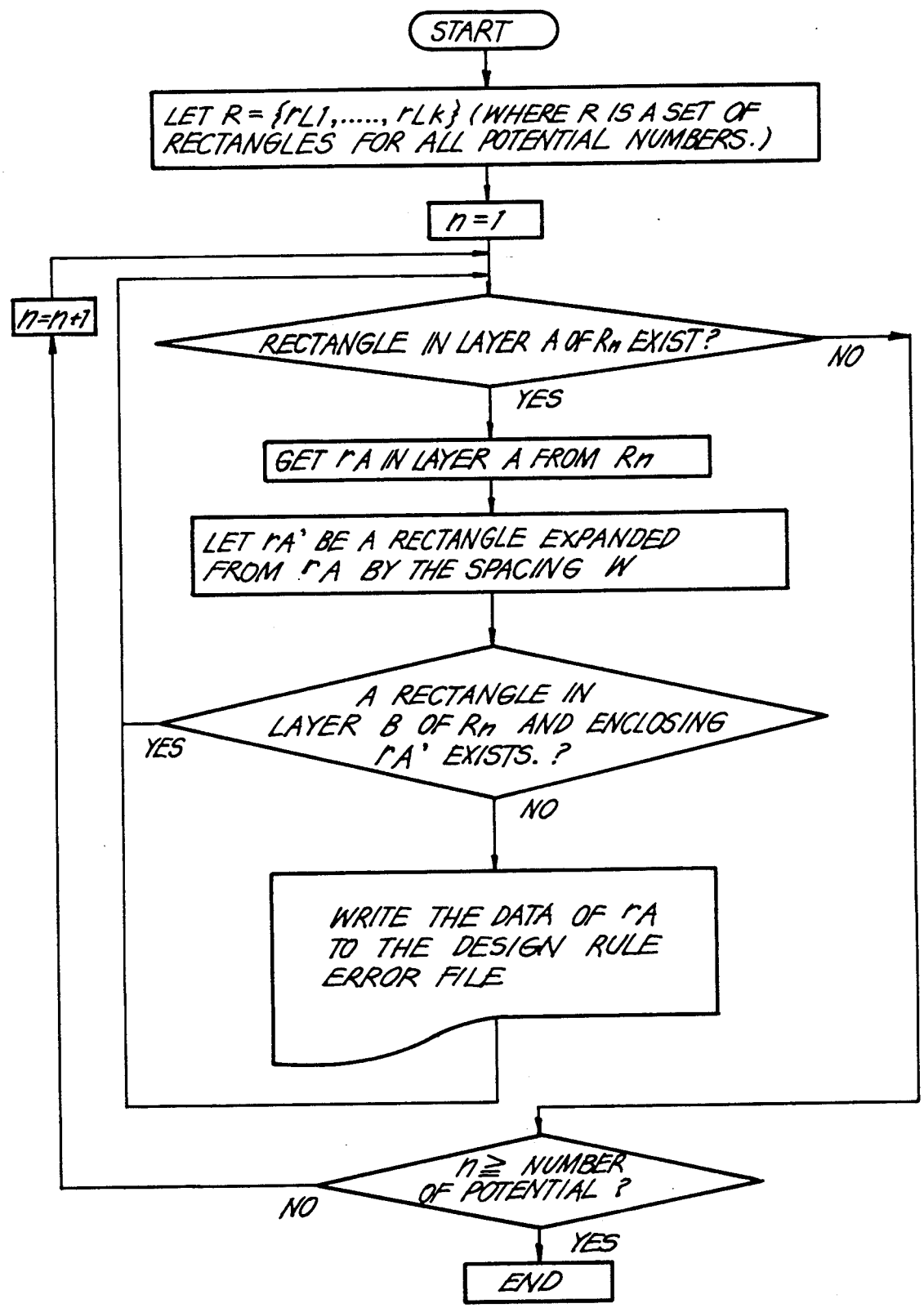
FIG. 24 is a flow chart for a second example of circuit pattern design rule check system.

The flow charts of FIG. 22 and FIG. 23 illustrate the routine that accomplishes the overlap check process. FIG. 23 is the routine that accomplished the "process DRC" step in FIG. 22.

The overlap check process follows the following steps.

Step 1. For each layer L, the rectangle data is sorted in an increasing sequence for the Y coordinates of the lower-left points of the rectangles and listed as R={$r_{Li}'$ ...., $r_{Lk}$}.

Step 2. For each layer L, processing is performed according to steps 3-6.

Step 3. Starting from the beginning of list $R_L$, rectangles $r_{Li}$ are taken out in sequence for processing according to steps 4-6.

Step 4. From list $R_L$, after $r_{Li}$, rectangle $r_{Lj}$ is taken out in sequence, if the Y coordinate of the lower-left point of $r_{Lj}$ is smaller than the Y coordinate of the upper-right point of $r_{Li}$, processing is performed according to steps 5-6.

Step 5. $r_{Li}$ is expanded by the design minimum spacing D on layer L, forming rectangle $r_{Li}'$.

Step 6. If the coordinates of the two points of $r_{Li}$ are $(X_1, Y_1)$, $(X_2, Y_2)$, then these coordinates of $r_{Li}'$ and $r_{Lj}$ have an overlapped portion. Rectangle $r_{Li}$ and $r_{Lj}$ are sent into the design rule error file.

Figure 11:
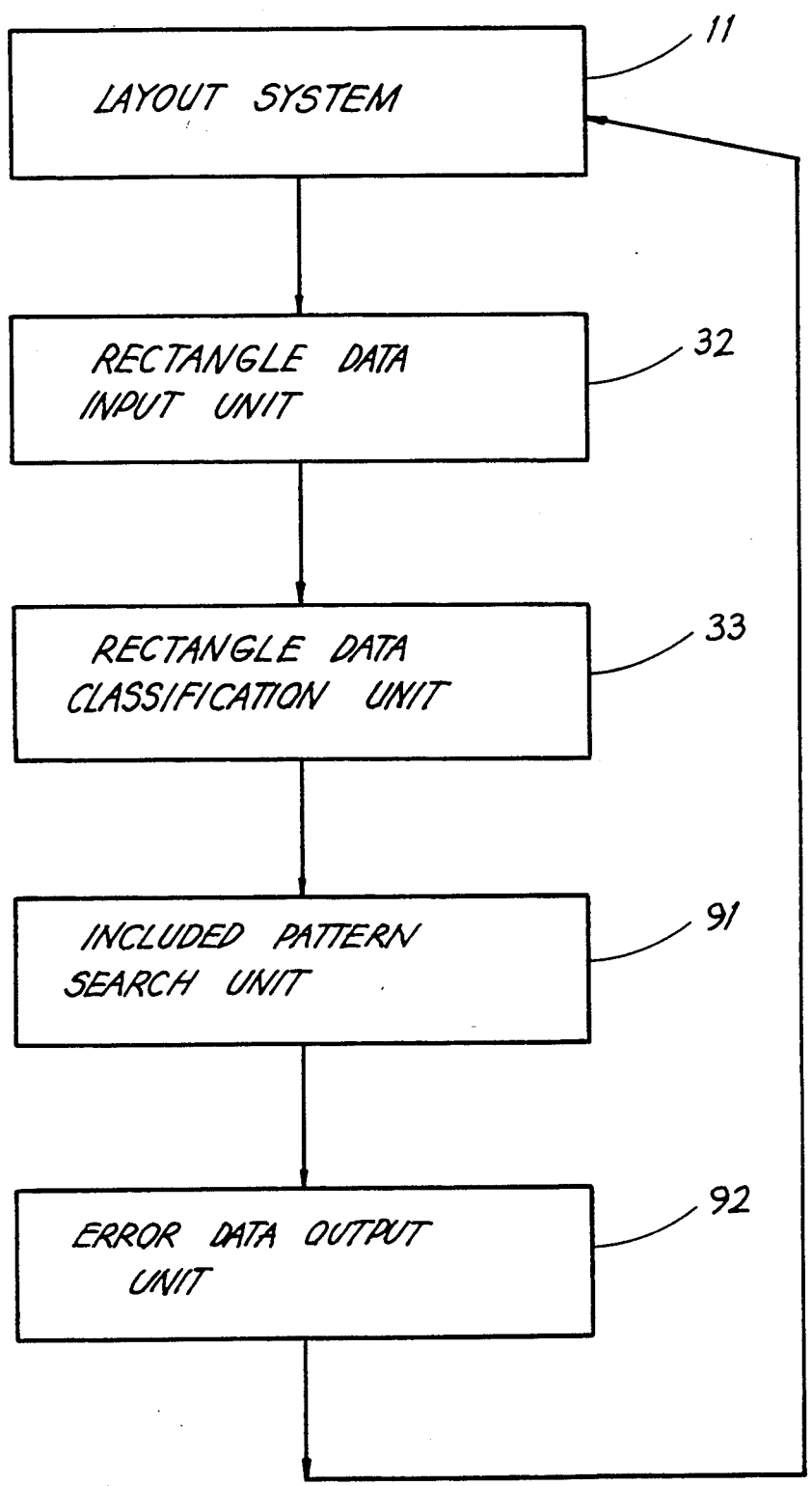
FIG. 11 is a circuit flow diagram for a pattern design rule check system according to the present invention.

The process illustrated in FIG. 11 checks the establishment of the following condition between two layers A and B: "For any rectangle on layer A, there always exists a rectangle on layer B that can contain a rectangle on layer A formed by expanding all the edges of the above-mentioned rectangle on layer A by a distance of W." The flow chart of FIG. 22 illustrates this procedure.

Inclusion Check Procedure

The inclusion check procedure follows the following steps.

Step 1. The patterns formed by the layout system 11 are sent to the pattern design rule check system by rectangle data input unit 32.

Step 2. The circuit rectangles are classified by rectangle data classification unit 33 into its various potential numbers.

Figure 12:
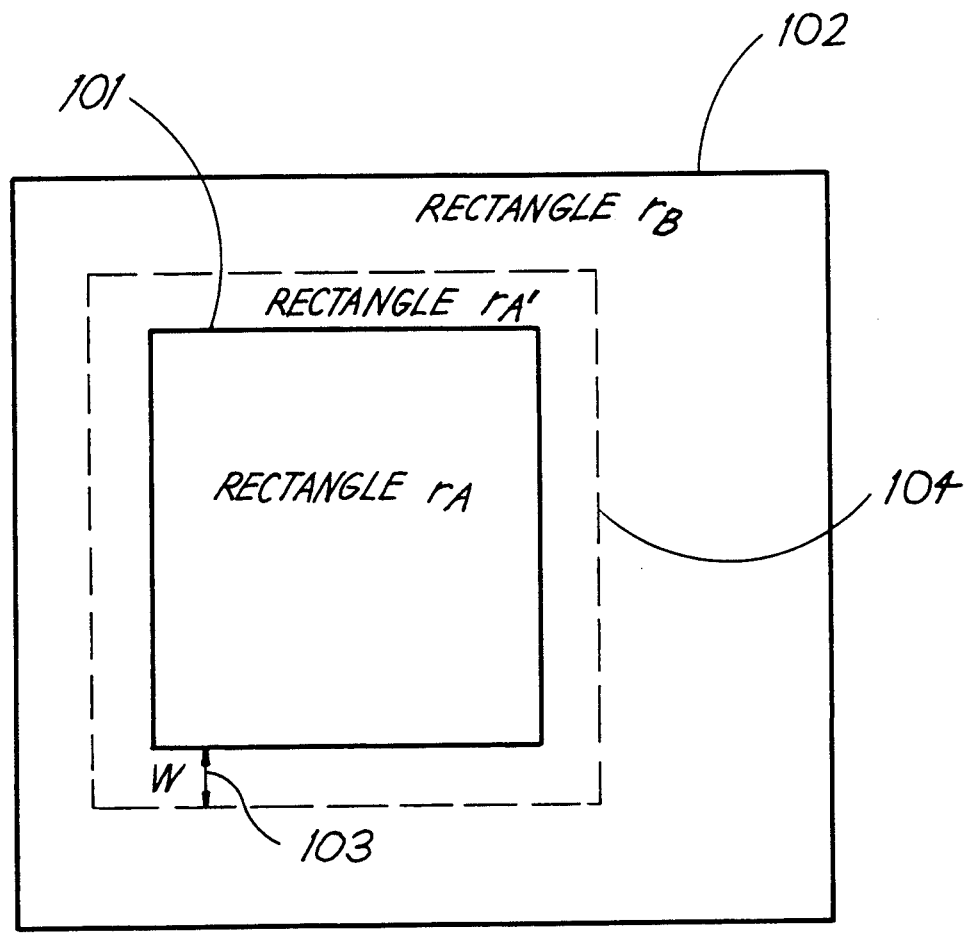
FIG. 12 is an abstracted illustration of an operation according to the present invention.

Step 3. As illustrated in FIG. 12, for a rectangle set of each potential number for each rectangle $r_A$ 101 on inner layer A, a rectangle $r_B$ 102 on layer B in the same set that contains rectangle $r_{A'}$ 104 formed by expanding all the edges of rectangle $r_A$ 101 by a distance W 103 in the peripheral direction is searched.

Step 4. In the case when no such rectangle $r_B$ 102 can be found, the error information is sent into the design rule error file (not shown). The content of the error file is sent back to layout system 11 using error data output unit 92.

In the above-mentioned process, searching of the adjacent patterns and included patterns is performed without using the already described slit method. However, the slit method can also be used.

Pattern Connectivity Verification System

Figure 13:
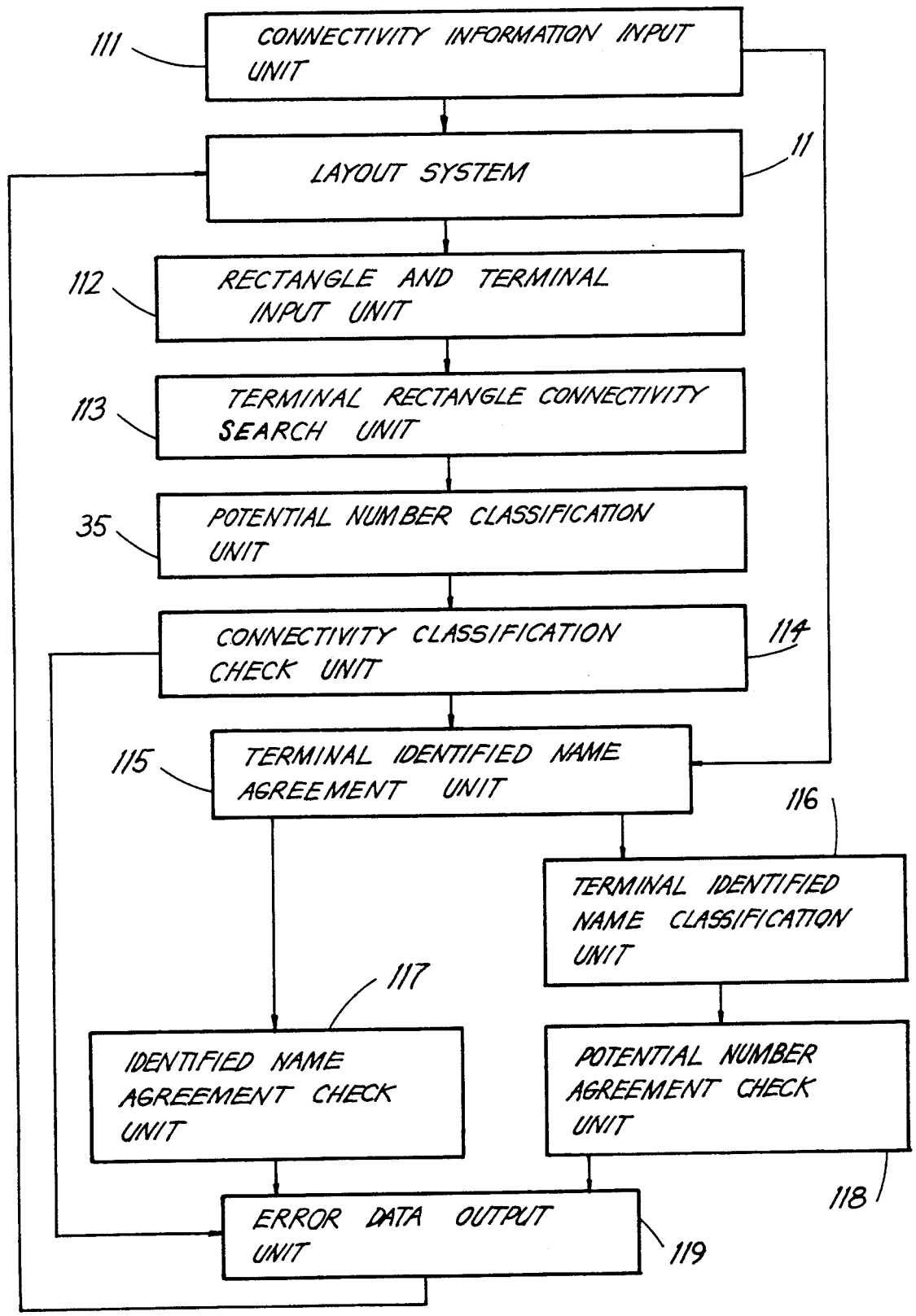
FIG. 13 is a circuit flow diagram for a pattern connectivity verification system according to the present invention.

FIG. 13 shows an example of the pattern connectivity verification system of this invention.

Connectivity information input unit 111 is used for transferring the connectivity description that gives the identified name (net name) to the set of terminal names that should be connected to the same potential in the layout system. The connectivity information unit expresses which terminals are connected together. Based on the transferred connectivity description, layout system 11 generates the layout pattern expressed entirely by rectangles, with each rectangle identified by the layer containing it and its potential number, and with each terminal identified by the layer containing it and its terminal name. This data is sent to pattern connectivity check system using a rectangle and terminal input unit 112.

Rectangle and terminal input unit 112 describes each rectangle by way of coordinates of the left-bottom and right-top corners, its potential number and layer number. It describes each terminal by its coordinates, net name and layer number. It retrieves this information from various files.

With the aid of terminal rectangle and connectivity search unit 113, the rectangles connected to each terminal 113 are identified. Terminal and rectangle connectivity search unit determines whether a terminal connects with a rectangle by determining whether the terminal is located on one of the four edges of the rectangle. The coordinates of the terminal and rectangle are use to make this determinant.

For each terminal, the potential numbers of the rectangles connected to it are determined. Afterwards, the rectangles and terminals are classified into sets by potential number, by potential number classification unit 35. Then, for the set of rectangles and terminals having the same potential number, connectivity classification check unit 114 is used to determine whether the rectangles and terminals are geometrically connected.

If this condition does not hold, for a certain set of rectangles and terminals, the rectangles and terminals contained in the set of the potential number are outputted to the error file using error data output unit 119. Error data output unit 119 provides the rectangles and terminals that fail the connectivity procedure stated above. The rectangles are identified by its potential number, layer number, and lower-left at upper-right corner coordinates. The terminals are identified by terminal name, layer number, and its x-y coordinate. The data in this file is then sent back to layout system 11.

With the aid of terminal identified name agreement unit 115, each terminal $P_i^*$ obtained from the layout information is compared with each terminal $P_j$ obtained from the connectivity description. This unit checks the terminal $P_j$ obtained from the schematic entry against the terminal $P_i^*$ obtained by the resulting layout. The logical terminal $P_j$ and its corresponding geometrical terminal $P_i^*$ are given the same name. The unit simply provides each identified pairs of terminals, logical and geometric.

The terminals $P_i^*$ and the corresponding terminals $P_j$ are picked out and the identified name (net name) of terminal $P_j$ is given to terminal $P_i^*$.

For each set of terminals and rectangles classified according to their potential number as described above, identified name agreement check unit 117 is used to determine whether the same identified name is given to all the terminals contained in this set. If the same identified name is not given to all of them, all the terminals and rectangles contained in this set are outputted to the error file by error data output unit 119. The data in this file is then sent back to layout system 11. Identified name agreement check unit 117 simply collects all the terminals having the same potential number and then checks to see if they have the same terminal name.

With the aid of terminals identified classification unit 116, terminals are classified by their identified names. This unit classifies each terminal according to this terminal name which it gets on layout. The unit simply collects terminals having the same terminal name. Therefore set of terminals are obtained. For the set of terminals with each identified name, potential number agreement check unit 118 is used to determine whether any two terminals contained in this set are contained in the set having the same potential number. Potential number agreement check unit 118 simply collects all the terminals having the same terminal name and checks to see if they all have the same potential number. If they do not, all the terminals and rectangles contained in the set are outputted to the error file by error data output unit 119. The data in this file is sent back to layout system 11.

Figure 14:
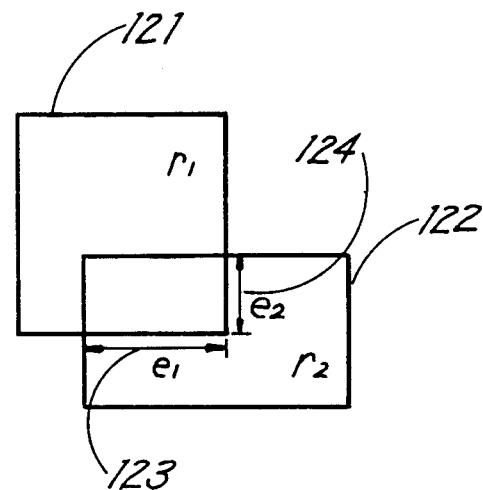
FIG. 14 is an abstracted illustration of an operation according to the present invention.

FIG. 14 illustrates the connectivity verification of two rectangles $r_1$ 121 and $r_2$ 122 when they are given. Only when one of the lengths of overlapped edge $e_1$ 123 and $e_2$ 124 of rectangles $r_1$ 121 and $r_2$ 122 is larger than the design rule in the layout, and rectangles $r_1$ 121 and $r_2$ 122 are located on the same layer, are the two rectangles connected.

Figure 15:
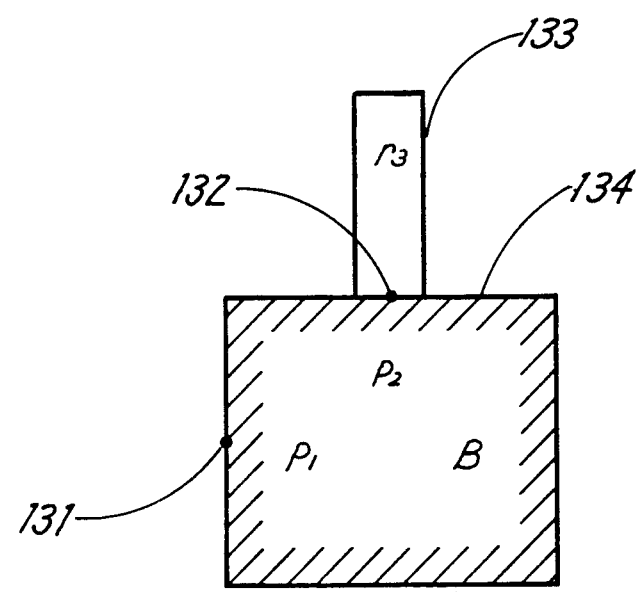
FIG. 15 is an abstracted illustration of the verification of connectivity between two terminals and the connectivity between a terminal and a rectangle according to the present invention.

FIG. 15 illustrates a check of connectivity between terminals $P_1$ 131 and $P_2$ 132 and between terminal $P_2$ 132 and rectangle 133, when two terminals $P_1$ 131 and $P_2$ 132, a rectangle $r_3$ 133, and a block B 134 are given. Only when terminal $P_2$ 132 is contained in rectangle $r_3$ 133 (including the boundary) and they are located on the same layer, are they connected.

On the other hand, only when terminals $P_1$ 131 and $P_2$ 132 are contained in block B 134 (including the boundary), and terminals $P_2$ 131 and $P_2$ 132 have the same terminal name, are they connected.

The check procedure illustrated in FIGS. 14 and 15 is implemented using terminal rectangle connectivity search unit 113 and connectivity classification check unit 114 of FIG. 13.

Figure 16:
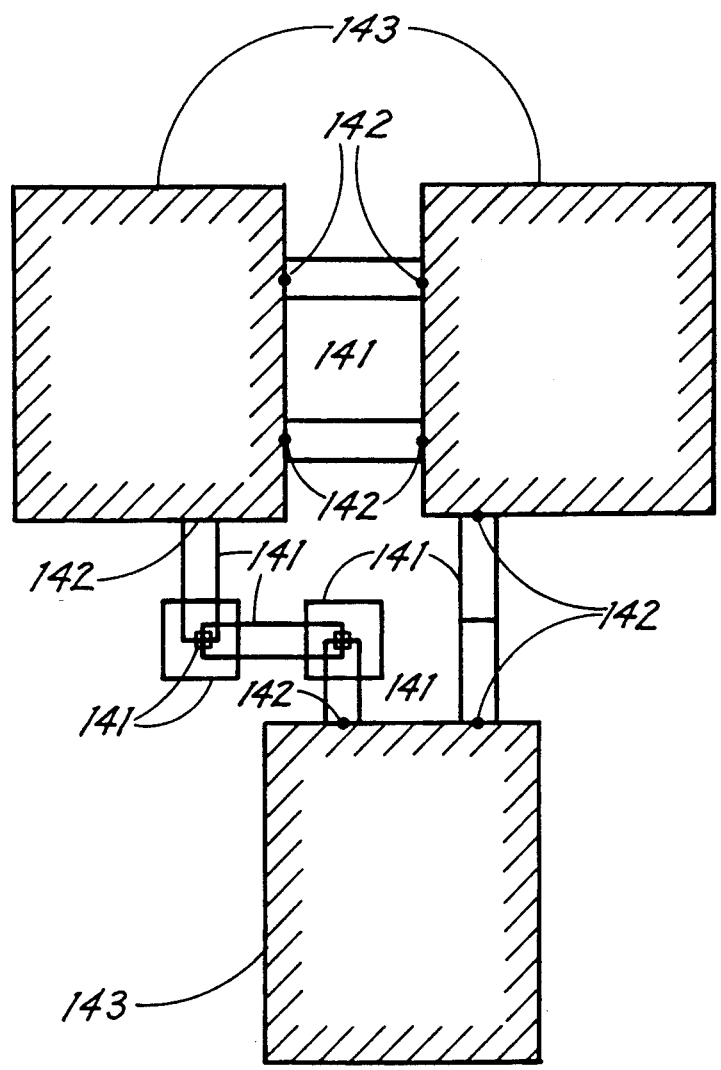
FIG. 16 abstractly illustrates the connectivity verification of patterns according to the present invention.

FIG. 16 illustrates the pattern connectivity check method when rectangles $K_N$ 141, terminals $P_n$ 142, and blocks B 143 are given. The procedure is as follows:

(1) For each set of terminals and rectangles classified by potential number, a check is made to see whether the terminals and rectangles contained in the set are connected to the same potential.

(2) For each set of terminals and rectangles classified by potential number, a check is made to see whether all the terminals contained in the set are given the same identifying name.

(3) A check is made to see whether any two terminals having the same terminal name are contained in the set having the same potential number.

If any of the above-mentioned (1)-(3) tests fail, error data is outputted to the error file using error data output unit 119 (FIG. 13); the data of this file is then sent back to automatic layout system 11 (FIG. 13).

We will now describe the processing flow of the pattern connectivity check. The above-mentioned check 1 is implemented by steps 1 to 11. The above-mentioned checks 2 and 3 are implemented in step 12.

Connectivity—Check Procedure

Figure 25A:
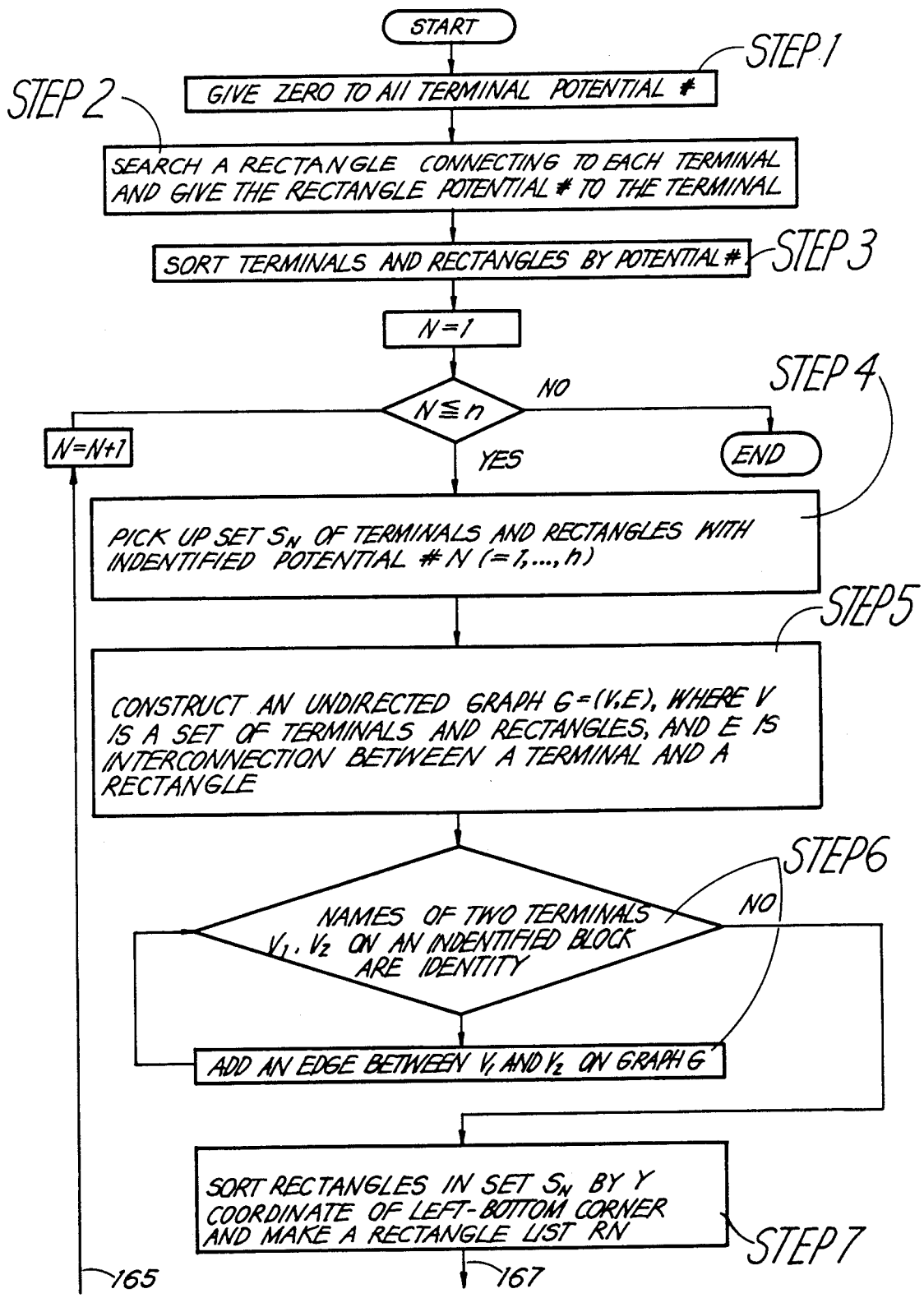
FIGS. 25A, B and C are flow charts for an example of connectivity verification of patterns.
Figure 25B:
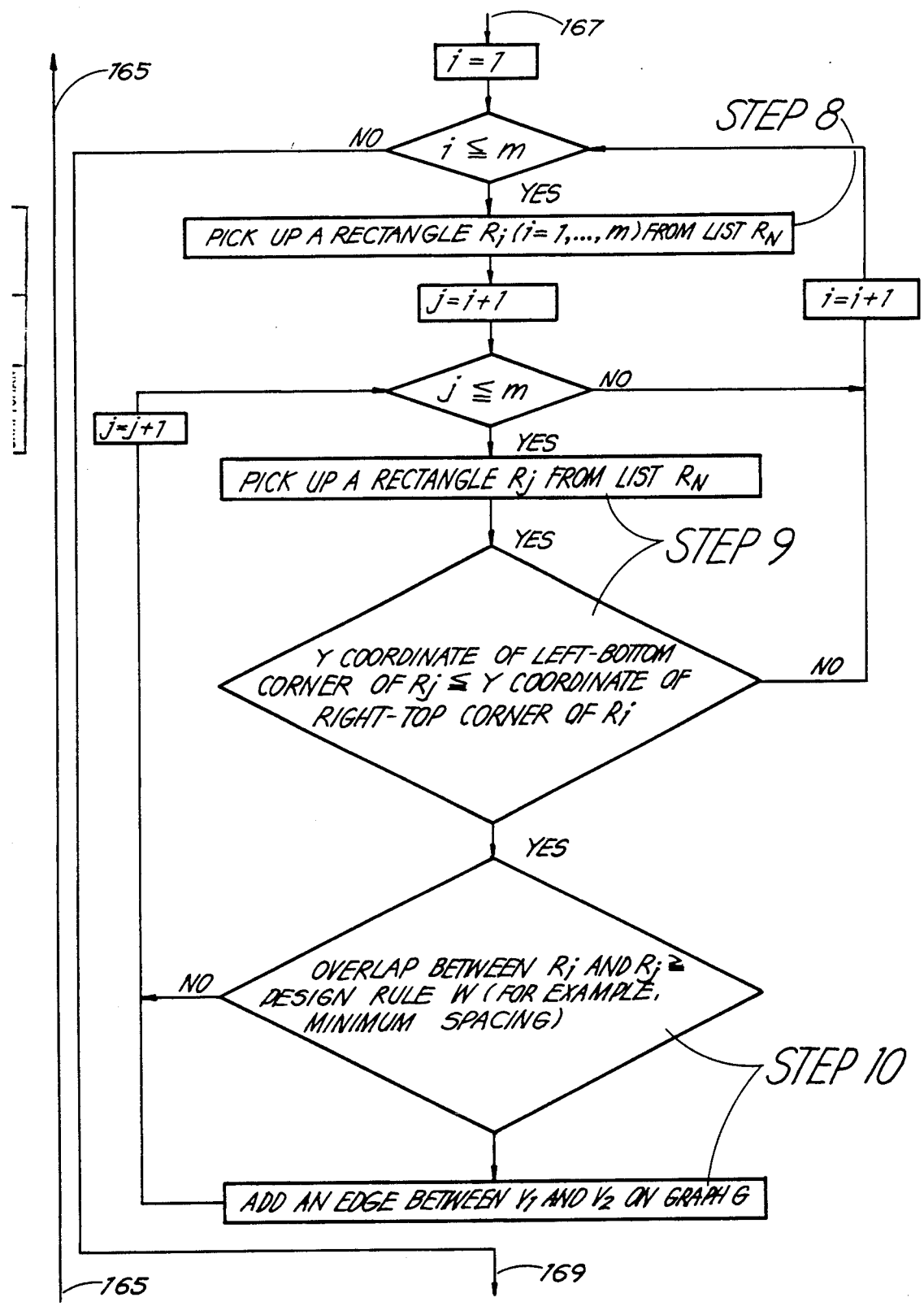
Figure 25C:
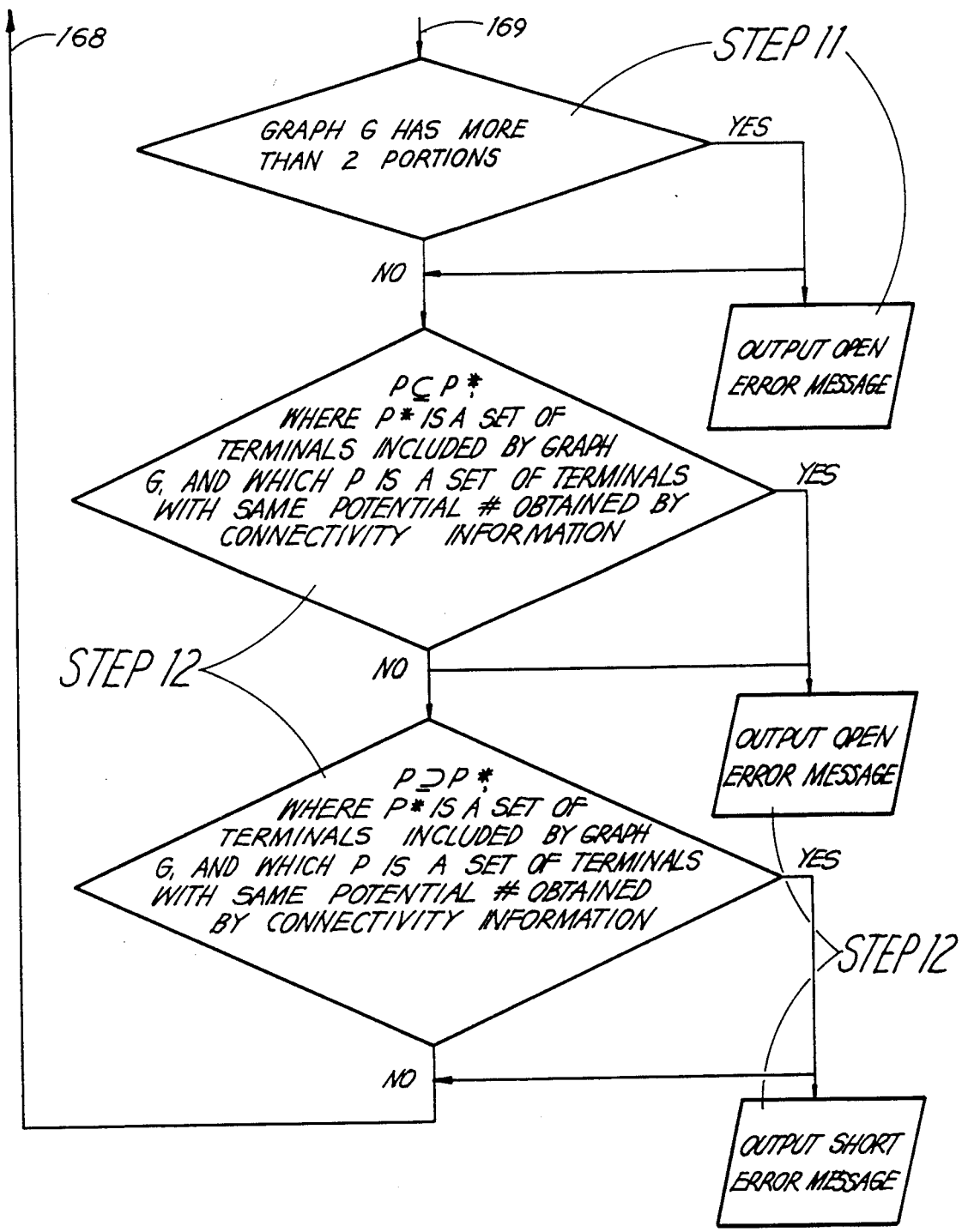

The flow chart of FIG. 25 illustrates the routine that accomplishes this procedure. The connectivity—check procedure follows the following steps.

Step 1. All the net numbers of the terminals contained in the pattern data are set to zero.

Step 2. With the aid of the adjacent pattern search method, rectangle r connected to each terminal p is searched; net number $n_r$ of r is given to net number $n_p$ of p.

Step 3. Terminals and rectangles are classified by net numbers N.

Step 4. For the set of terminals and rectangles of each net N, steps 5–12 are performed.

Step 5. With the set of vertex corresponding to the terminals and rectangles denoted by V, undirected graph G=(V,E), is formed. Between terminal p and rectangle r connected to p, an edge is drawn.

Step 6. An edge is drawn between any two terminals $P_1$, $P_2$ and having the same terminal name on a same block.

Step 7. The set of rectangles is sorted according to the Y coordinates of the lower-left points and listed as $R_N = \{r_{N1}, r_{N2}, \ldots, r_{Nm}\}$.

Step 8. Rectangles $r_{Ni}$ are taken out in sequence starting from the beginning of list $R_N$, and steps 9–10 are performed.

Step 9. From list $R_N$, rectangle $r_{Nj}$, which follows $r_{Ni}$, is taken out in sequence. If the Y coordinate of the lower-left corner of $r_{Nj}$ is smaller than the Y coordinate of the upper-right corner of $r_{Ni}$, the following processing is performed.

Step 10. If the overlapped portion between $r_{Ni}$ and $r_{Nj}$ is larger than the design rule, they are taken as connected with each other, and an edge is drawn between $r_{Ni}$ and $r_{Nj}$.

Step 11. The number of connected components of graph G is investigated, and if it is 2 or larger, an open error message is outputted.

Step 12. The set of terminals contained in graph G is taken as P* and the set of terminals with the same potential number obtained by connectivity information is taken as P; a check is performed for the following two conditions; (1) $P_i \geq P^*$, (2) $P_i < P^*$. When (1) fails, an open error message is outputted; when (2) fails, a short error message is outputted.

Layout system

Figure 17:
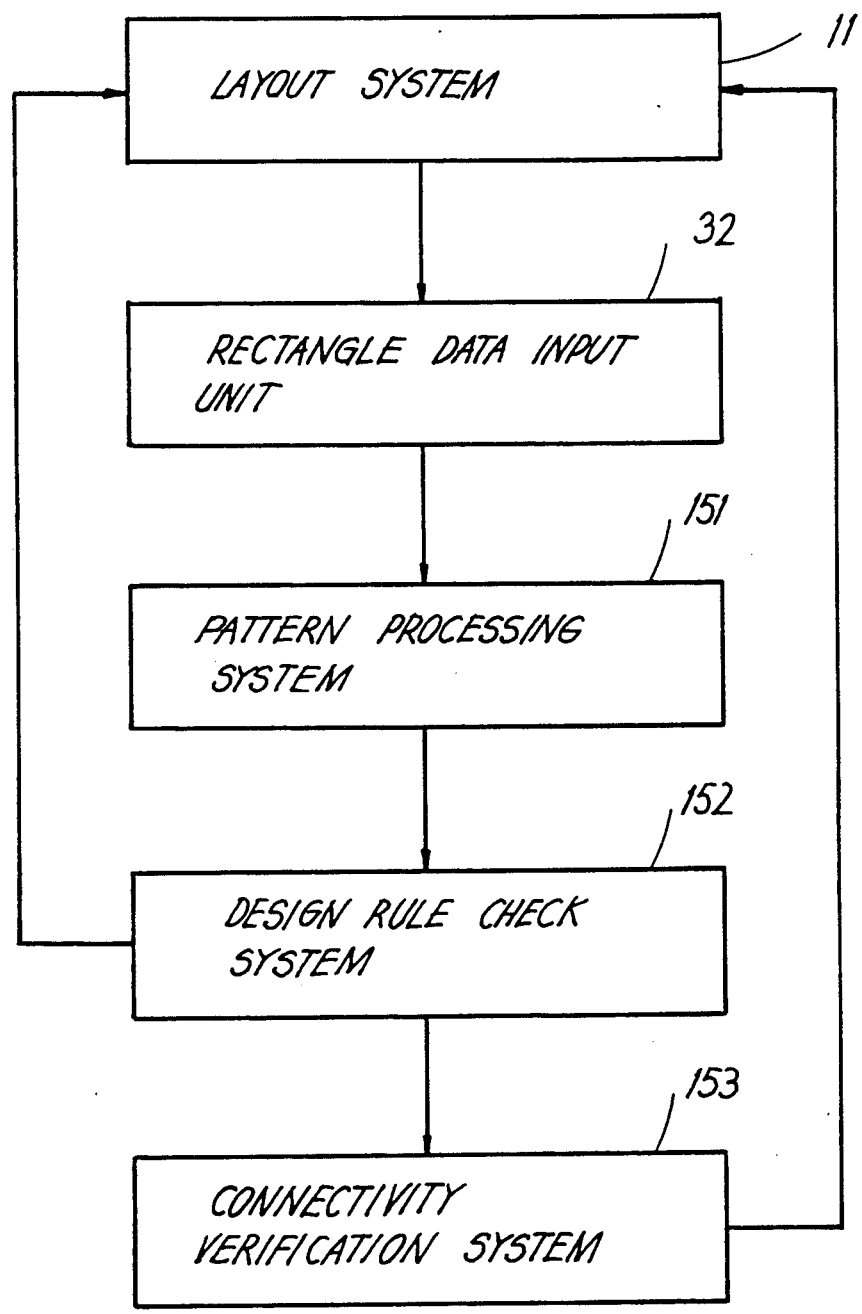
FIG. 17 is a flow diagram for a pattern processing system according to the present invention.
Figure 18:
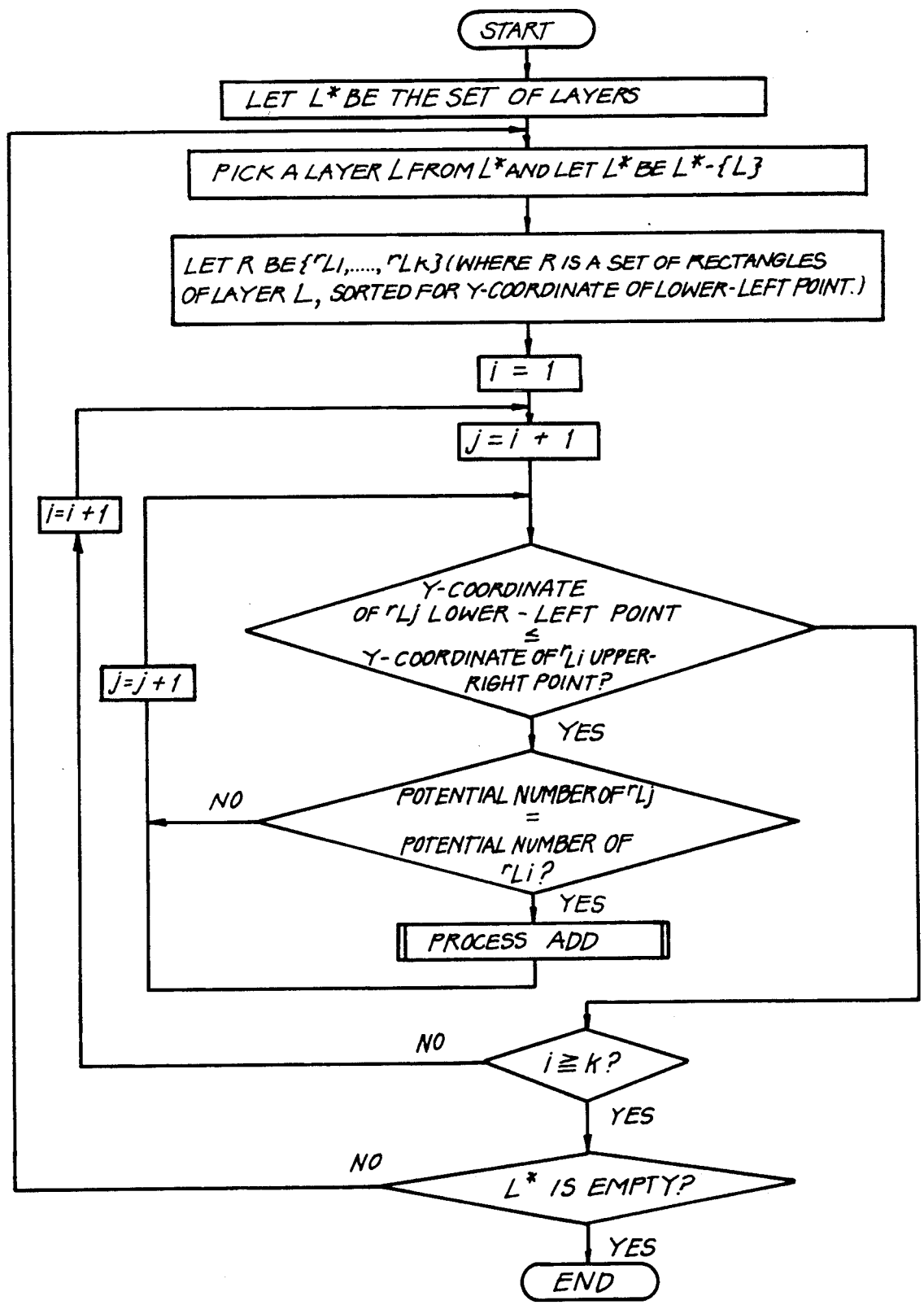
FIG. 18 is a flow chart for an example of a pattern processing system.
Figure 19:
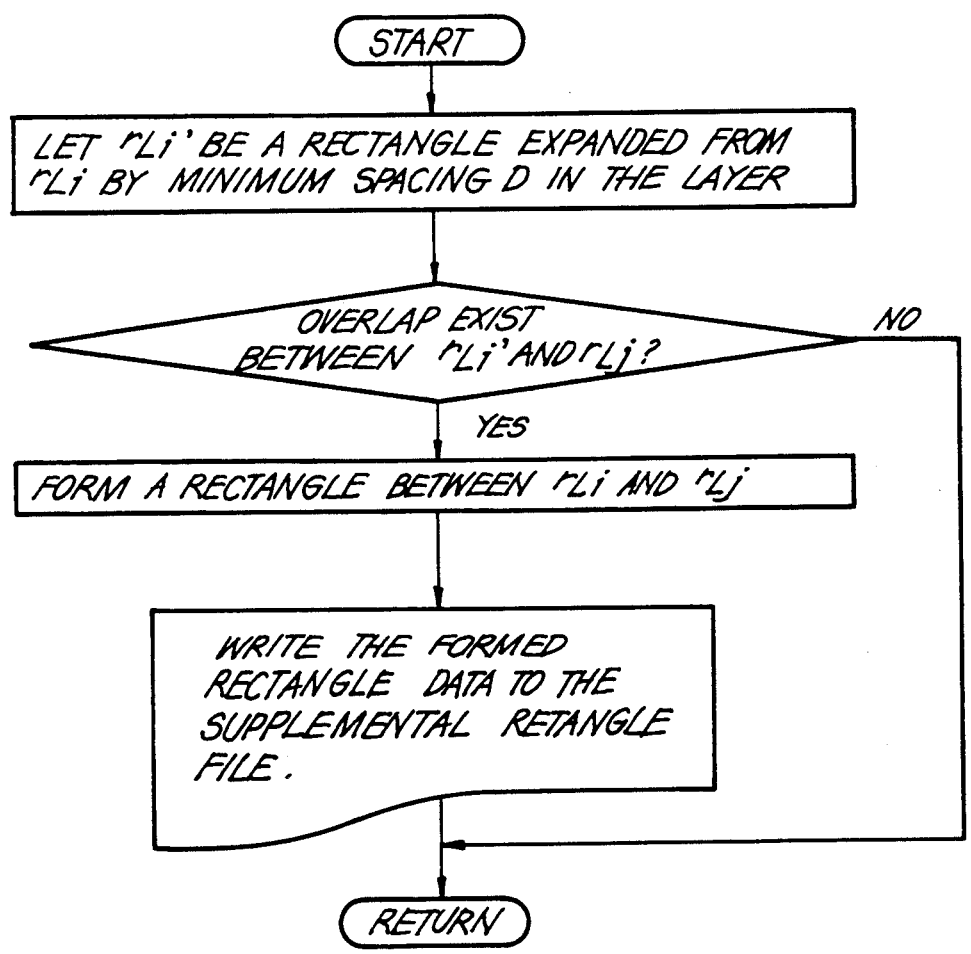
FIG. 19 is a flow chart explanation of process ADD in FIG. 18.
Figure 20:
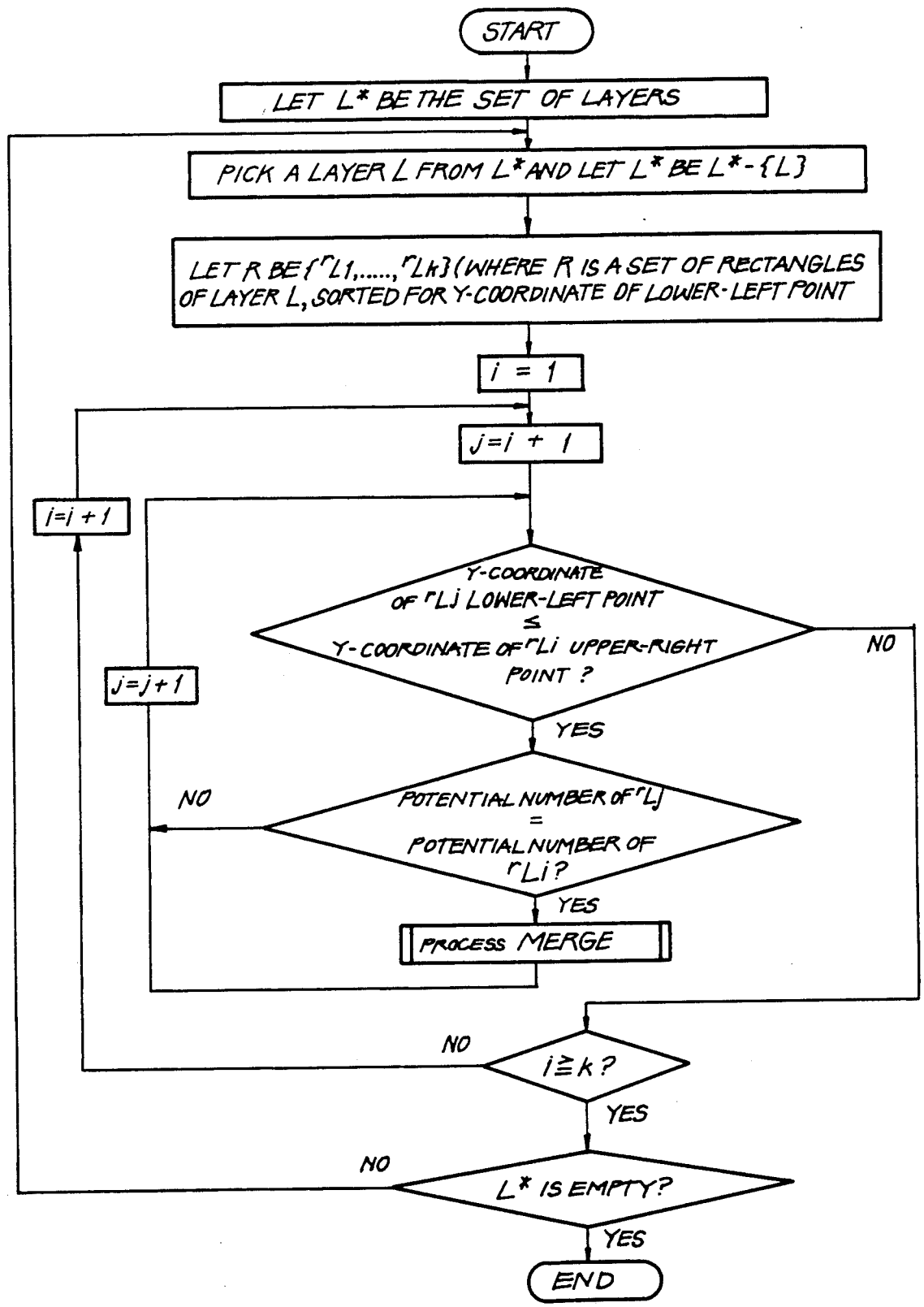
FIG. 20 is a flow chart for a second example of a pattern processing system.
Figure 21:
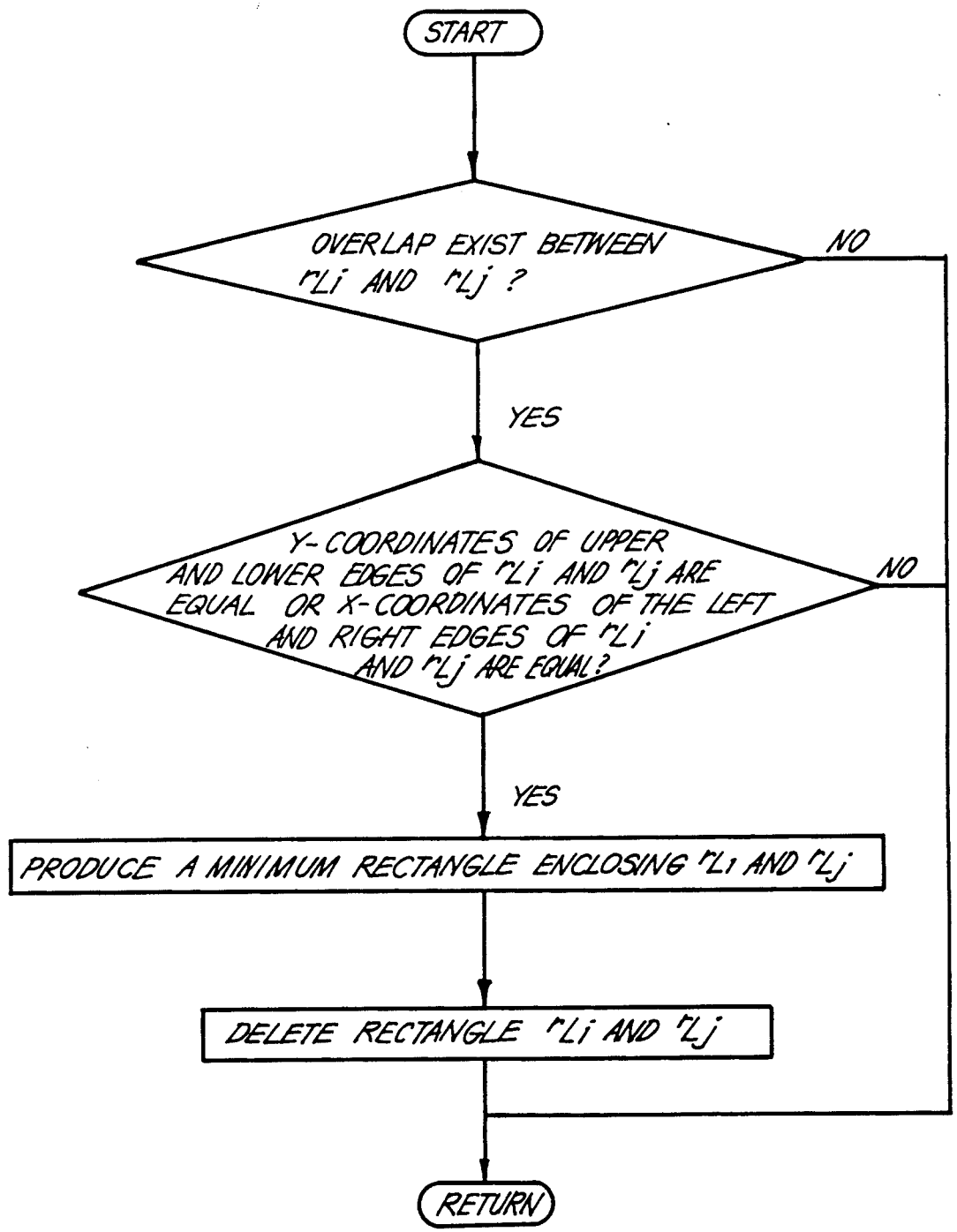
FIG. 21 is a flow chart explanation of process MERGE in FIG. 20.

An application example of the layout system according to this invention is illustrated in FIG. 17.

All the patterns generated by layout system 11 are rectangles. The layout pattern formed by these rectangles may contain notches and slits. Then the rectangles are put into the pattern processing system 151 by rectangle data input unit 32 to remove notches and slits as already described. Afterwards, the design rule check is performed using design rule check system 152. If the pattern is found to contain portions not satisfying the design rule, it is sent back to layout system 11 for an amendment to the layout.

If the design rule check system 152 shows no error connectivity verification system 153 is used to perform the connectivity check to see whether the layout will perform as desired. If an error message is put out, it is sent back to the layout system for an amendment to the layout. On the other hand, if there is no error found by the connectivity verification system 153, the overall layout process is completed.

What is claimed is:

1. A pattern processing system for laying out multilayer LSI circuits, said layout systems comprising:
   means for characterizing a circuit pattern by a set of rectangles, each rectangle being identified by a potential number, a layer number and coordinates;
   means for receiving said rectangles and the design minimum spacing defined for each layer;
   means for classifying said rectangles according to layer;
   means for selecting any two adjacent rectangles from the classified set of rectangles for a certain layer;
   means for determining whether the selected two adjacent rectangles have the same potential number;

means for determining whether the selected two adjacent rectangles are spaced further apart than the minimum spacing defined for said layer; and means for adding a rectangle characterized by the same potential number and layer number as said two adjacent rectangles to cover the space between said selected two adjacent rectangles when their spacing is less than said design minimum spacing.

2. The pattern processing system for claim 1 further comprising:

means for determining whether said selected two adjacent rectangles overlap at any point;

means for determining whether the pattern formed by merging said selected two adjacent rectangles is still a rectangle; and means for merging said two adjacent rectangles into one rectangle characterized by potential number, layer number and its new coordinates, said merging means creating a new merged rectangle when it is determined that the two selected rectangles overlap at some point and the pattern formed by merging them is still a rectangle.

3. A circuit pattern design rule check system comprising:

means for characterizing a circuit pattern by a set of rectangles, each rectangle being identified by a potential number, a layer number and coordinates;

means for receiving said rectangles and the design minimum spacing defined for each layer;

means for classifying said rectangle according to layer;

means for selecting any two adjacent rectangles from the classified set of rectangles for a certain layer;

means for determining whether the selected two adjacent rectangles have the same potential number;

means for determining whether the selected two adjacent rectangles are spaced further apart than the minimum spacing defined for said layer; and means for outputting error data when the selected two adjacent rectangles are spaced further apart than said design minimum spacing for said layer.

4. A circuit pattern connectivity verification system, comprising:

means for receiving connectivity information wherein each terminal in the circuit pattern that should be connected to the same potential in said pattern is given the same net name;

means for characterizing a circuit pattern by a set of rectangles, each rectangle being identified by coordinates, a potential number and a layer number;

means for receiving layout information, including all the rectangles identified by coordinates, potential number and layer number, and all the terminals of said circuit pattern identified by coordinates, terminal name and layer number;

means for identifying the rectangles of said circuit pattern that are connected to said terminals;

means for classifying said received rectangles and said received terminals by potential number;

means for checking if the rectangles and terminals classified as having the same potential number are geometrically connected;

means for classifying said terminals by net name;

means for checking if any terminals with the same net name are in the same set classified by potential number;

means for checking if any terminals with the same potential number are in the same set classified by net name; and means for outputting the results of said these checks.

5. A pattern layout system, comprising:

means for receiving input data including connectivity information of the circuit pattern and the location of terminals on the periphery or in the interior of said pattern;

means for generating output data characterizing said pattern by rectangles identified by coordinates, potential number and layer number, and identifying the terminals by coordinates, terminal name and layer number;

modifying the output data from said generating means to delete undesirable notches and slits;

means for checking to determine if the output data from said generating means conforms to the design rules of the pattern being laid out; and means for checking to determine if the output data from said generating means satisfies the requirements of the input data received by said receiving means.

6. The pattern layout system of claim 5 further comprising means for manually changing the output data from said generating means.

7. A pattern processing system for laying out multilayer LSI circuits, said layout system comprising:

means for characterizing a circuit pattern by a set of rectangles, each rectangle being identified by a potential number, a layer number, and coordinates;

means for receiving said rectangles and the design minimum spacing defined for each layer;

means for classifying said rectangles according to layer;

means for selecting any two adjacent rectangles from said classified set of rectangles;

means for determining whether the selected two adjacent rectangles have the same potential number;

means for determining whether the pattern formed by merging said two rectangles is still a rectangle; and means for merging the two adjacent rectangles into one rectangle, characterized by the same potential number and layer number as said two rectangles but with new coordinates, wherein said merging means creates a new merged rectangle when it is determined that the two selected rectangles overlap at some point and the pattern formed by merging them is still a rectangle.

8. A circuit pattern design rule check system, for checking the condition that a rectangle on one layer "A" is included by a rectangle on another layer "B" when the rectangle on layer "B" is expanded in all directions by a distance "W," said check system comprising:

means for characterizing a circuit pattern by a st of rectangles, each rectangle being identified by a potential number, a layer number, and coordinates;

means for receiving said rectangles and the design minimum spacing defined for each layer;

means for classifying said rectangles according to layer;

means for checking whether a rectangle on layer "B," when expanded in all directions by said distance "W," includes a rectangle on said layer "A"; and means for outputting error data as the result of said check.

* * * * *